United States Patent
Kim et al.

(10) Patent No.: US 10,818,328 B2
(45) Date of Patent: Oct. 27, 2020

(54) NONVOLATILE MEMORY DEVICE, OPERATION METHOD OF THE NONVOLATILE MEMORY DEVICE, AND OPERATION METHOD OF MEMORY CONTROLLER CONTROLLING THE NONVOLATILE MEMORY DEVICE

(71) Applicant: Samsung Electronics Co., Ltd., Suwon-si (KR)

(72) Inventors: Sung Joon Kim, Hwaseong-si (KR); Eun-Jin Yun, Seoul (KR); Sanghoan Chang, Suwon-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 16/372,223

(22) Filed: Apr. 1, 2019

(65) Prior Publication Data

US 2020/0035278 A1    Jan. 30, 2020

(30) Foreign Application Priority Data

Jul. 24, 2018    (KR) ........................ 10-2018-0085868

(51) Int. Cl.
| | |
|---|---|
| *G11C 8/10* | (2006.01) |
| *G11C 16/08* | (2006.01) |
| *G11C 16/26* | (2006.01) |
| *G11C 7/22* | (2006.01) |
| *H03K 19/173* | (2006.01) |

(52) U.S. Cl.
CPC ............... *G11C 8/10* (2013.01); *G11C 7/22* (2013.01); *G11C 16/08* (2013.01); *G11C 16/26* (2013.01); *H03K 19/1733* (2013.01)

(58) Field of Classification Search
CPC ........... G11C 8/10; G11C 16/26; G11C 16/08; G11C 7/22; G11C 16/32; H03K 19/1733
See application file for complete search history.

(56) References Cited

U.S. PATENT DOCUMENTS

| | | | |
|---|---|---|---|
| 6,760,274 | B2 | 7/2004 | Roohparvar |
| 7,369,447 | B2 | 5/2008 | Louie et al. |
| 8,301,827 | B2 | 10/2012 | Yeh |
| 8,320,200 | B2 | 11/2012 | Yamamura et al. |
| 9,495,288 | B2 | 11/2016 | Cohen |
| 9,542,309 | B2 | 1/2017 | Lasser |

(Continued)

*Primary Examiner* — Gene N Auduong
(74) *Attorney, Agent, or Firm* — Muir Patent Law, PLLC

(57) ABSTRACT

A nonvolatile memory device includes a control logic circuit that receives a read command from outside the nonvolatile memory device, a memory cell array which includes a plurality of memory cells connected to a plurality of word lines, an address generator that generates a plurality of addresses based on read information from the outside of the nonvolatile memory device, an address decoder sequentially selects a plurality of pages in at least one word line, which correspond to the plurality of addresses, a page buffer circuit that is connected to the memory cell array through a plurality of bit lines, and prepares a plurality of sequential data from memory cells connected to the selected pages by the address decoder, and an input/output circuit that continuously outputs the plurality of sequential data from the page buffer circuit to the outside of the nonvolatile memory device through data lines.

20 Claims, 25 Drawing Sheets

(56) References Cited

U.S. PATENT DOCUMENTS

| | | |
|---|---|---|
| 2006/0140027 A1 | 6/2006 | Tominaga |
| 2013/0128668 A1* | 5/2013 | Kim .................. G11C 8/08 365/185.11 |
| 2018/0088867 A1 | 3/2018 | Kaminaga et al. |
| 2020/0004432 A1* | 1/2020 | Sharon ................ G06F 3/0613 |
| 2020/0004540 A1* | 1/2020 | Navon ................ G06F 13/1631 |

* cited by examiner

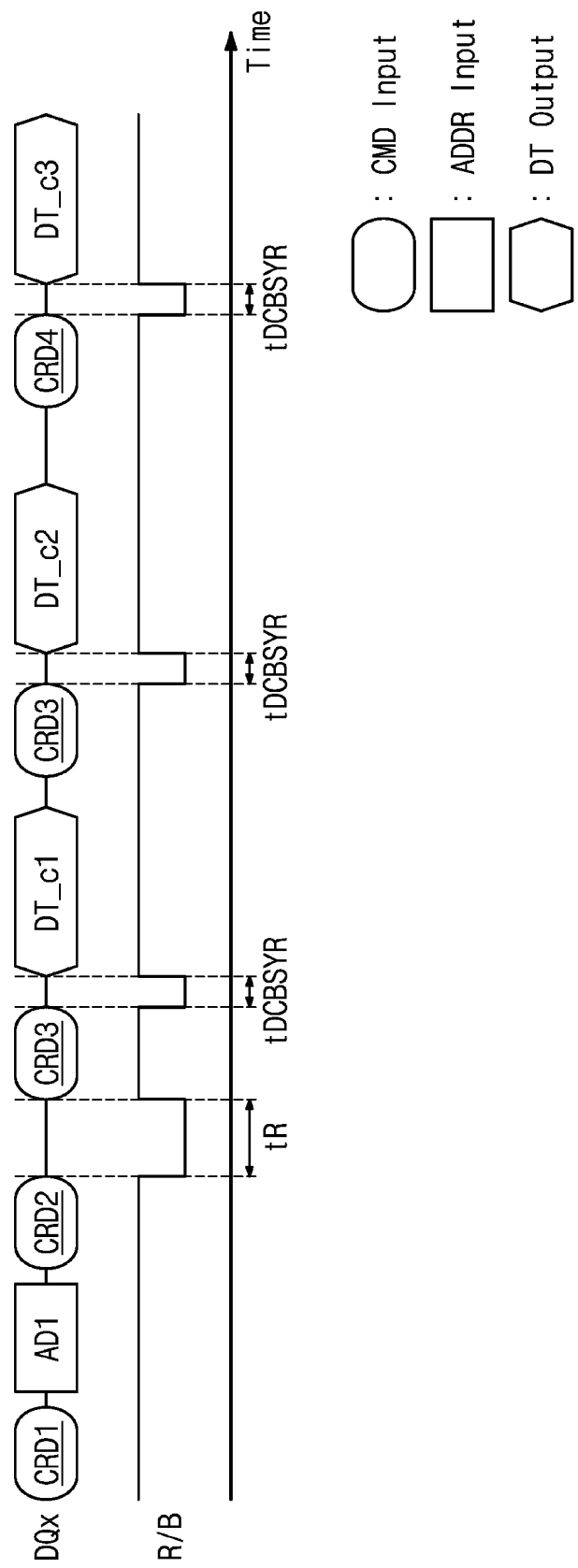

[2nd Sequential Read Mode SRM_2]

[3rd Sequential Read Mode SRM_3]

[4th Sequential Read Mode SRM_4]

FIG. 11

LUT

| SRM | Policy |
|---|---|
| SRM_1 | 1st to last pages in i-th BLK |
| SRM_2 | a-th to b-th pages in i-th BLK |
| SRM_3 | c-th page in each BLK |
| ⋮ | ⋮ |
| SRM_n | Customizing Policy |

| Variable |
|---|
| i, a, b, ... |

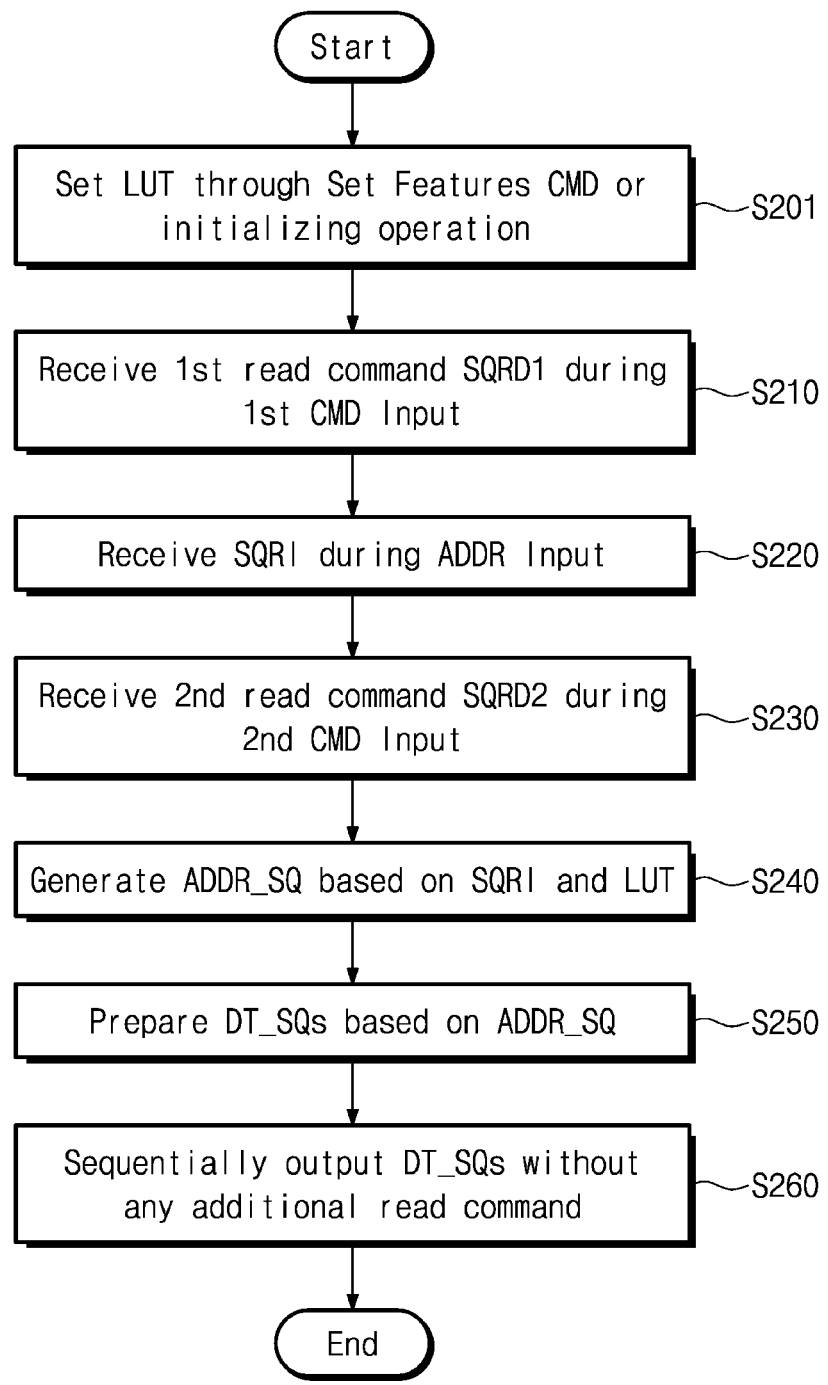

FIG. 16A

| DT | ADDR_SQ |
|---|---|
| DT_1 | ADDR_SQ11~ADDR_SQ1i |
| DT_2 | ADDR_SQ21~ADDR_SQ2k |
| ⋮ | ⋮ |
| DT_m | ADDR_SQm1~ADDR_SQmj |

FIG. 16B

| DT | SRM | SDS | NSD | Variable |
|---|---|---|---|---|
| DT_1 | SRM_1 | SDS_1 | NSD_1 | V_1 |
| DT_2 | SRM_2 | SDS_2 | NSD_2 | V_2 |
| ⋮ | ⋮ | ⋮ | ⋮ | ⋮ |
| DT_m | SRM_m | SDS_m | NSD_m | V_m |

…

NONVOLATILE MEMORY DEVICE, OPERATION METHOD OF THE NONVOLATILE MEMORY DEVICE, AND OPERATION METHOD OF MEMORY CONTROLLER CONTROLLING THE NONVOLATILE MEMORY DEVICE

CROSS-REFERENCE TO RELATED APPLICATIONS

This application claims priority under 35 U.S.C. § 119 to Korean Patent Application No. 10-2018-0085868 filed on Jul. 24, 2018, in the Korean Intellectual Property Office, the disclosure of which is incorporated by reference herein in its entirety.

BACKGROUND

Embodiments of the inventive concept relate to a semiconductor memory, and more particularly, relate to a nonvolatile memory device, an operation method of the nonvolatile memory device, and an operation method of a memory controller controlling the nonvolatile memory device.

Semiconductor memories are classified into a volatile memory device, in which stored data disappear when a power is interrupted, such as a static random access memory (SRAM) or a dynamic random access memory (DRAM) and a nonvolatile memory device, in which stored data are retained even when a power is interrupted, such as a flash memory device, a phase-change RAM (PRAM), a magnetic RAM (MRAM), a resistive RAM (RRAM), or a ferroelectric RAM (FRAM).

The flash memory device is being widely used as a storage medium in computing devices. In general, the flash memory device manages data based on a page. For example, the flash memory device operates in response to a read command or a write command, which is based on a page, from a memory controller. That is, since a command or an address invoke is used based on a page for the purpose of controlling the flash memory device, an overhead occurs due to the command or address invoked upon conveying a large amount of data.

SUMMARY

Embodiments of the inventive concept provide a nonvolatile memory device with improved reliability, an operation method of the nonvolatile memory device, and an operation method of a memory controller controlling the nonvolatile memory device.

According to an exemplary embodiment, a nonvolatile memory device includes a control logic circuit that receives a sequential read command from outside the nonvolatile memory device, a memory cell array which includes a plurality of memory cells connected to a plurality of word lines, a sequential address generator that generates a plurality of sequential addresses based on sequential read information received from the outside of the nonvolatile memory device, under control of the control logic circuit receiving the sequential read command, an address decoder that is connected to the memory cell array through the plurality of word lines and sequentially selects a plurality of pages in at least one word line, which correspond to the plurality of sequential addresses, from among the plurality of word lines, under control of the control logic circuit receiving the sequential read command, a page buffer circuit that is connected to the memory cell array through a plurality of bit lines, and prepares a plurality of sequential data from memory cells connected to the selected pages by the address decoder, under control of the control logic circuit receiving the sequential read command, and an input/output circuit that continuously outputs the plurality of sequential data from the page buffer circuit to the outside of the nonvolatile memory device through data lines, under control of the control logic circuit. The plurality of sequential data are stored in the memory cells connected to the selected pages. While the input/output circuit continuously outputs the plurality of sequential data, the plurality of sequential data are continuously output without an additional read command received from the outside of the nonvolatile memory device.

According to an exemplary embodiment, an operation method of a nonvolatile memory device includes receiving a first sequential read command from outside the nonvolatile memory device through data lines during a first command input interval, receiving sequential read information from the outside of the nonvolatile memory device through the data lines during an address input interval following the first command input interval, receiving a second sequential read command from the outside of the nonvolatile memory device through the data lines during a second command input interval following the address input interval, and continuously outputting a plurality of sequential data based on the sequential read information after the second command input interval. The plurality of sequential data correspond to a plurality of physical pages, respectively. While the plurality of sequential data are output, an additional read command is not received by the nonvolatile memory device from the outside of the nonvolatile memory device through the data lines.

According to an exemplary embodiment, an operation method of a memory controller which controls a nonvolatile memory device includes transmitting a first sequential read command to the nonvolatile memory device through data lines during a first command input interval, transmitting sequential read information to the nonvolatile memory device through the data lines during an address input interval following the first command input interval, transmitting a second sequential read command to the nonvolatile memory device through the data lines during a second command input interval following the address input interval, and after the second command input interval, providing a read enable signal to the nonvolatile memory device to continuously receive a plurality of sequential data from the nonvolatile memory device. The plurality of sequential data are stored in memory cells connected to a plurality of selected physical pages of a memory cell array of the nonvolatile memory device

BRIEF DESCRIPTION OF THE FIGURES

The above and other objects and features of the inventive concept will become apparent by describing in detail exemplary embodiments thereof with reference to the accompanying drawings.

FIGS. 4A to 4C are timing diagrams illustrating operations of a nonvolatile memory device.

FIG. 11 is a diagram illustrating a look-up table of FIG. 10 according to example embodiments.

FIG. 12A is a flowchart illustrating an operation of a nonvolatile memory device of FIG. 10 according to example embodiments.

FIG. 16A is a diagram illustrating information managed by a sequential address generator included in a memory controller of FIG. 15A according to example embodiments.

FIG. 16B is a diagram illustrating information managed by a sequential data manager included in a memory controller of FIG. 15B according to example embodiments.

DETAILED DESCRIPTION

Below, embodiments of the inventive concept may be described in detail and clearly to such an extent that an ordinary one in the art easily implements the inventive concept.

Figure 1:
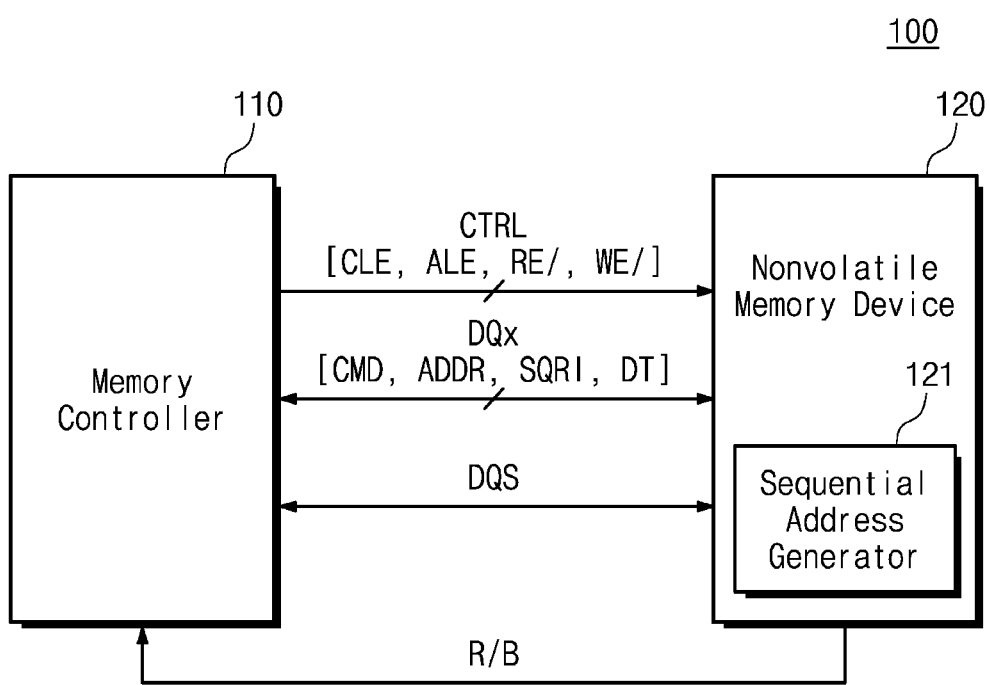
FIG. 1 is a block diagram illustrating a memory system according to example embodiments of the inventive concept.

FIG. 1 is a block diagram illustrating a memory system according to example embodiments of the inventive concept. Referring to FIG. 1, a memory system 100 may include a memory controller 110 and a nonvolatile memory device 120. In an embodiment, the memory system 100 may be a high-capacity storage medium, which is used in a computing device, such as a solid state drive (SSD) or a memory card.

The memory controller 110 may be configured to control the nonvolatile memory device 120 in response to a request of an external device (e.g., a host, a central processing unit (CPU), or an application processor (AP)) or under control of the external device. For example, to control the nonvolatile memory device 120, the memory controller 110 may send and receive various signals through control signal lines CTRL, data lines DQx, and a data strobe line DQS.

In an exemplary embodiment, various signals such as a command latch enable signal CLE, an address latch enable signal ALE, a read enable signal RE/, or a write enable signal WE/ may be provided to the nonvolatile memory device 120 through the control signal lines CTRL. Various information such as a command CMD, an address ADDR, and data DT may be sent and received between the memory controller 110 and the nonvolatile memory device 120 through the data lines DQx. In an exemplary embodiment, the memory controller 110 and the nonvolatile memory device 120 may distinguish and identify the command CMD, the address ADDR, and the data DT provided through the data lines DQx, based on various signals provided through the control signal lines CTRL and a data strobe signal DQS.

In response to various signals from the memory controller 110, the nonvolatile memory device 120 may store the data DT received from the memory controller 110 or may send the stored data DT to the memory controller 110. In an exemplary embodiment, in the case where the nonvolatile memory device 120 performs a program operation or a read operation under control of the memory controller 110, the nonvolatile memory device 120 may provide a ready/busy signal R/B to the memory controller 110, and the memory controller 110 may recognize that the nonvolatile memory device 120 is operating, in response to the ready/busy signal R/B. In an exemplary embodiment, in the case where the ready/busy signal R/B indicates a busy state, the memory controller 110 may not exchange information (e.g., a command, an address, or data) with the nonvolatile memory device 120.

In an exemplary embodiment, the nonvolatile memory device 120 may include an address generator 121 (hereinafter referred to as a "sequential address generator"). The sequential address generator 121 may be configured to generate a plurality of addresses based on advanced read information SQRI (hereinafter referred to as "sequential read information"), in an advanced read operation (hereinafter referred to as a "sequential read operation") according to example embodiments of the inventive concept. The nonvolatile memory device 120 may perform the sequential read operation by outputting a plurality of sequential data based on the plurality of sequential addresses thus generated.

In example embodiments, the sequential address generator 121 may generate a plurality of sequential addresses or a plurality of random addresses based on the sequential read information SQRI, in the sequential read operation.

In an exemplary embodiment, the sequential read operation according to example embodiments of the inventive concept may refer to a read operation in which a plurality of sequential data are output without an invoke or issue of a separate command or address of a page unit from the memory controller 110. Here, a command or an address of a page unit may be used to read data of one page (or one page data) or N pages (N is an integer equal to or smaller than the number of bits stored in one memory cell). For example, one word line may include one page or N pages. The terms "a command or an address based on a page", "a page-based command or address", and "a command or an address of a page unit" will be interchangeable. Through the sequential read operation, the nonvolatile memory device 120 may generate a plurality of sequential addresses based on the sequential read information SQRI provided from the memory controller 110 and may output a plurality of sequential data based on the plurality of sequential addresses thus generated. In an exemplary embodiment, the plurality of sequential addresses may correspond to different physical pages or different logical pages, respectively.

That is, a conventional nonvolatile memory device requires to invoke a command or an address of a page unit from a memory controller in order to perform a sequential cache read operation or a random cache read operation. In contrast, the nonvolatile memory device 120 according to the inventive concept may output a plurality of sequential data (i.e., a large amount of data) without an additional invoke of a command or an address of a page unit by generating a plurality of sequential addresses based on the sequential read information SQRI. This may mean that the performance of the nonvolatile memory device 120 is improved. The sequential read operation of the nonvolatile memory device 120 according to the inventive concept will be described with reference to accompanying drawings.

Figure 2:
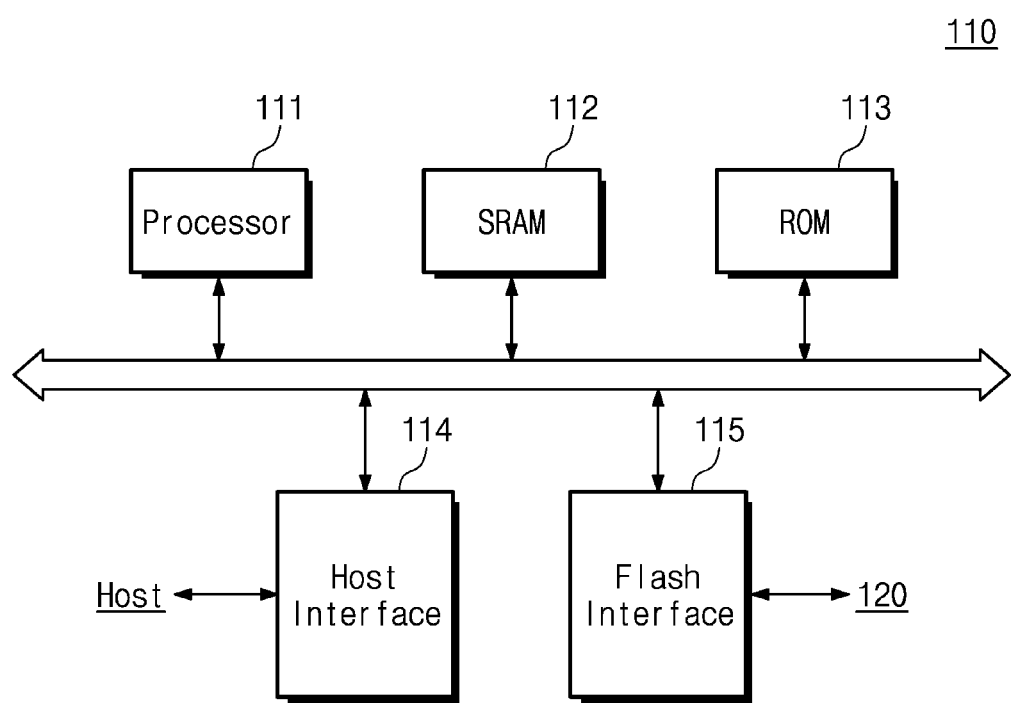
FIG. 2 is a block diagram illustrating a memory controller of FIG. 1 according to example embodiments.

FIG. 2 is a block diagram illustrating a memory controller of FIG. 1 according to example embodiments. Referring to FIGS. 1 and 2, the memory controller 110 may include a processor 111, a static RAM (SRAM) 112, a read only memory (ROM) 113, a host interface 114, and a flash interface 115.

The processor 111 may control overall operations of the memory controller 110. The SRAM 112 may be used as a buffer memory, a cache memory, or a working memory of the memory controller 110. The ROM 113 may store a variety of information necessary for the memory controller 110 to operate, in the form of firmware.

In an exemplary embodiment, various information (e.g., a flash translation layer FTL and a mapping table) necessary to control the nonvolatile memory device 120 may be stored in the SRAM 112 or a separate buffer memory, and may be managed or driven by the processor 111.

The memory controller 110 may communicate with an external device (e.g., host) through the host interface 114. In an exemplary embodiment, the host interface 114 may include at least one of various interfaces such as a double data rate (DDR) interface, a universal serial bus (USB) interface, a multimedia card (MMC) interface, a peripheral component interconnection (PCI) interface, a PCI-express (PCI-e) interface, an advanced technology attachment (ATA) interface, a serial-ATA (SATA) interface, a parallel-ATA (PATA) interface, a small computer small interface (SCSI) interface, an enhanced small disk interface (ESDI), an integrated drive electronics (IDE) interface, a mobile industry processor interface (MIPI), a nonvolatile memory-express (NVM-e) interface, and a nonvolatile memory-express (NVM-e) interface.

The memory controller 110 may communicate with the nonvolatile memory device 120 through the flash interface 115. In an exemplary embodiment, the memory controller 110 may provide various signals (e.g., CLE, ALE, RE/, WE/, CMD, ADDR, SQRI, and DT) described with reference to FIG. 1 to the nonvolatile memory device 120 based on the flash interface 115. In an exemplary embodiment, the flash interface 115 may include a NAND interface such as a toggle NAND interface or an open NAND flash interface (ONFI).

The memory controller 110 illustrated in FIG. 2 is an example, and the inventive concept is not limited thereto. The memory controller 110 may further include various components such as an error correction code (ECC) engine, a randomizer, and a buffer management circuit.

Figure 3:
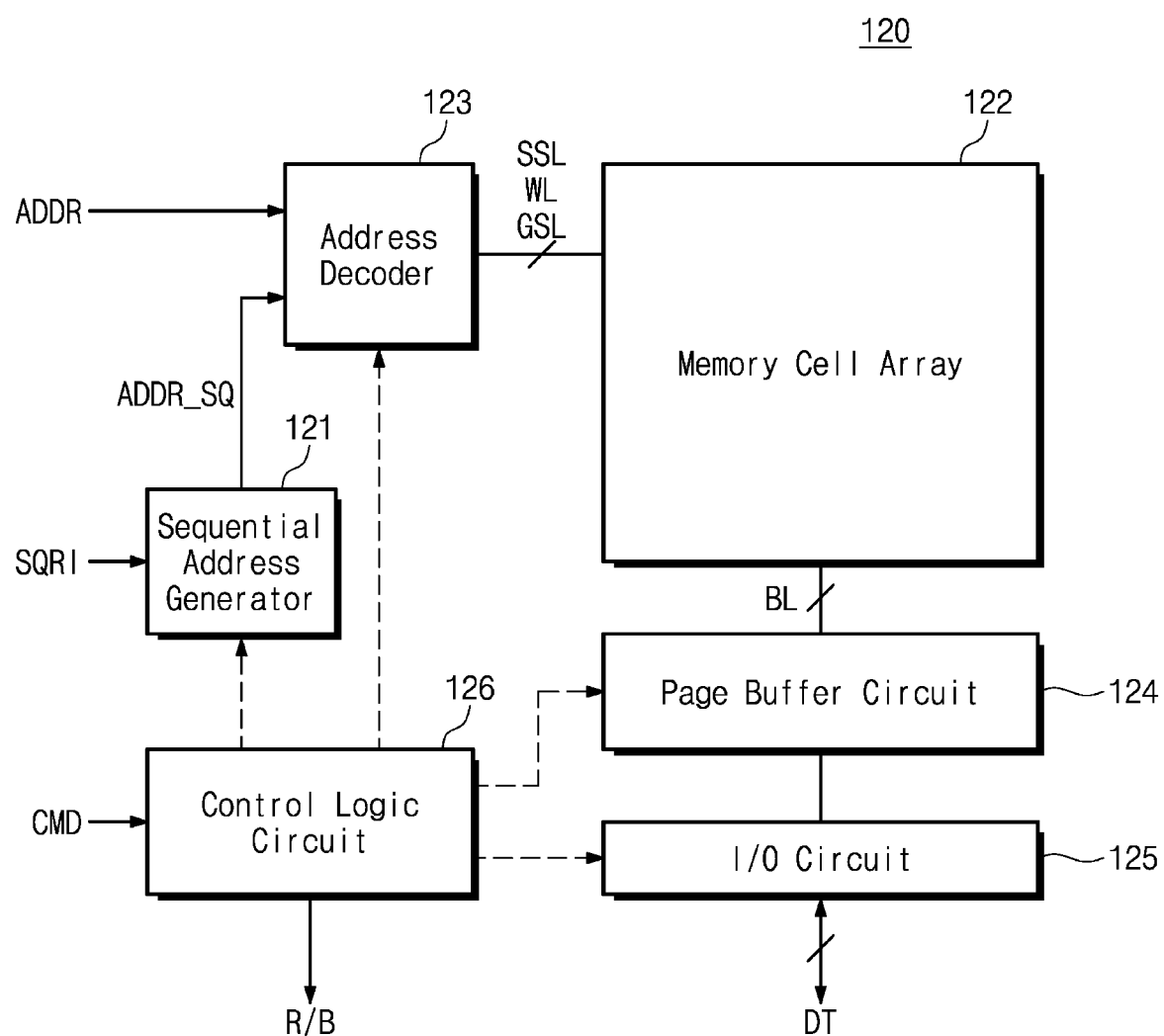
FIG. 3 is a block diagram illustrating a nonvolatile memory device of FIG. 1 according to example embodiments.

FIG. 3 is a block diagram illustrating a nonvolatile memory device of FIG. 1 according to example embodiments. Referring to FIGS. 1 and 3, the nonvolatile memory device 120 may include the sequential address generator 121, a memory cell array 122, an address decoder 123, a page buffer circuit 124, an input/output circuit 125, and a control logic circuit 126.

In an embodiment, for brevity of illustration and for convenience of description, the command CMD, the address ADDR, the sequential read information SQRI, and the data DT are separately illustrated, but the inventive concept is not limited thereto. For example, as described above, the command CMD, the address ADDR, the sequential read information SQRI, and the data DT may be received from the memory controller 110 through the data lines DQx and may be distinguished from each other based on control signals CTRL (e.g., CLE, ALE, RE/, and WE/).

The sequential address generator 121 may generate a sequential address ADDR_SQ based on the sequential read information SQRI received from the memory controller 110. For example, the nonvolatile memory device 120 may perform the sequential read operation in response to a sequential read command SQRD and the sequential read information SQRI from the memory controller 110. The sequential read operation refers to an operation of continuously outputting a plurality of sequential data without a separate command from the memory controller 110. In this case, the sequential address generator 121 may generate a plurality of sequential addresses ADDR_SQ for the sequential read operation, based on the sequential read information SQRI. For example, one of the plurality of sequential addresses ADDR_SQ may be a combination of one or more row addresses and one or more column addresses designating a particular word line and a particular page in the selected word line.

In an exemplary embodiment, the sequential read information SQRI may include information about a read mode (hereinafter referred to as a "sequential read mode"), information about the size of sequential data, the number of sequential data, etc. The sequential address generator 121 may generate the plurality of sequential addresses ADDR_SQ, based on the information about the sequential read mode. The number of the sequential addresses ADDR_SQ thus generated may correspond to the number of the sequential data described above.

In an exemplary embodiment, the plurality of sequential addresses ADDR_SQ may correspond to pieces of different page data, respectively. The pieces of different page data may refer to physical page data stored in memory cells connected to different word lines. Alternatively, the pieces of different page data may indicate pieces of different logical page data, respectively. That is, the plurality of sequential addresses ADDR_SQ may indicate addresses for different pages.

The memory cell array 122 may include a plurality of memory blocks. Each of the memory blocks may include a plurality of cell strings, which are connected with bit lines BL and each of which includes a plurality of cell transistors connected in series. The plurality of cell transistors may be connected to string selection lines SSL, word lines WL, or ground selection lines GSL.

The address decoder 123 may be connected to the memory cell array 122 through the string selection lines SSL, the word lines WL, and the ground selection lines GSL. The address decoder 123 may decode the address ADDR received from the memory controller 110 or the plurality of sequential addresses ADDR_SQ received from the sequential address generator 121 and may control the string selection lines SSL, the word lines WL, and the ground selection lines GSL based on a result of the decoding. For example, the address decoder 123 may sequentially select and control word lines, which correspond to the plurality of sequential addresses ADDR_SQ, from among a plurality of word lines of the memory cell array 122.

The address decoder 123 may select a plurality of pages in one or more word lines of the memory cell array 122 through the string selection lines SSL, the word lines WL, and the ground selection lines GSL.

The page buffer circuit 124 is connected to the memory cell array 122 through bit lines BL. The page buffer circuit 124 may be configured to temporarily store data to be stored to the memory cell array 122 or data read from the memory cell array 122.

The input/output circuit 125 may provide the data DT received from the memory controller 110 to the page buffer circuit 124. The input/output circuit 125 may provide the data DT received from the page buffer circuit 124 to the memory controller 110.

The control logic circuit 126 may receive the command CMD from the memory controller 110 and may control components of the nonvolatile memory device 120 such that an operation corresponding to the received command CMD is performed.

In an exemplary embodiment, in the case where the command CMD received from the memory controller 110 is a sequential read command, the control logic circuit 126 may allow the sequential address generator 121 to generate the sequential address ADDR_SQ based on the sequential read information SQRI. In this case, the generated sequential address ADDR_SQ may be a starting address to read data from memory cells.

Figure 4A:
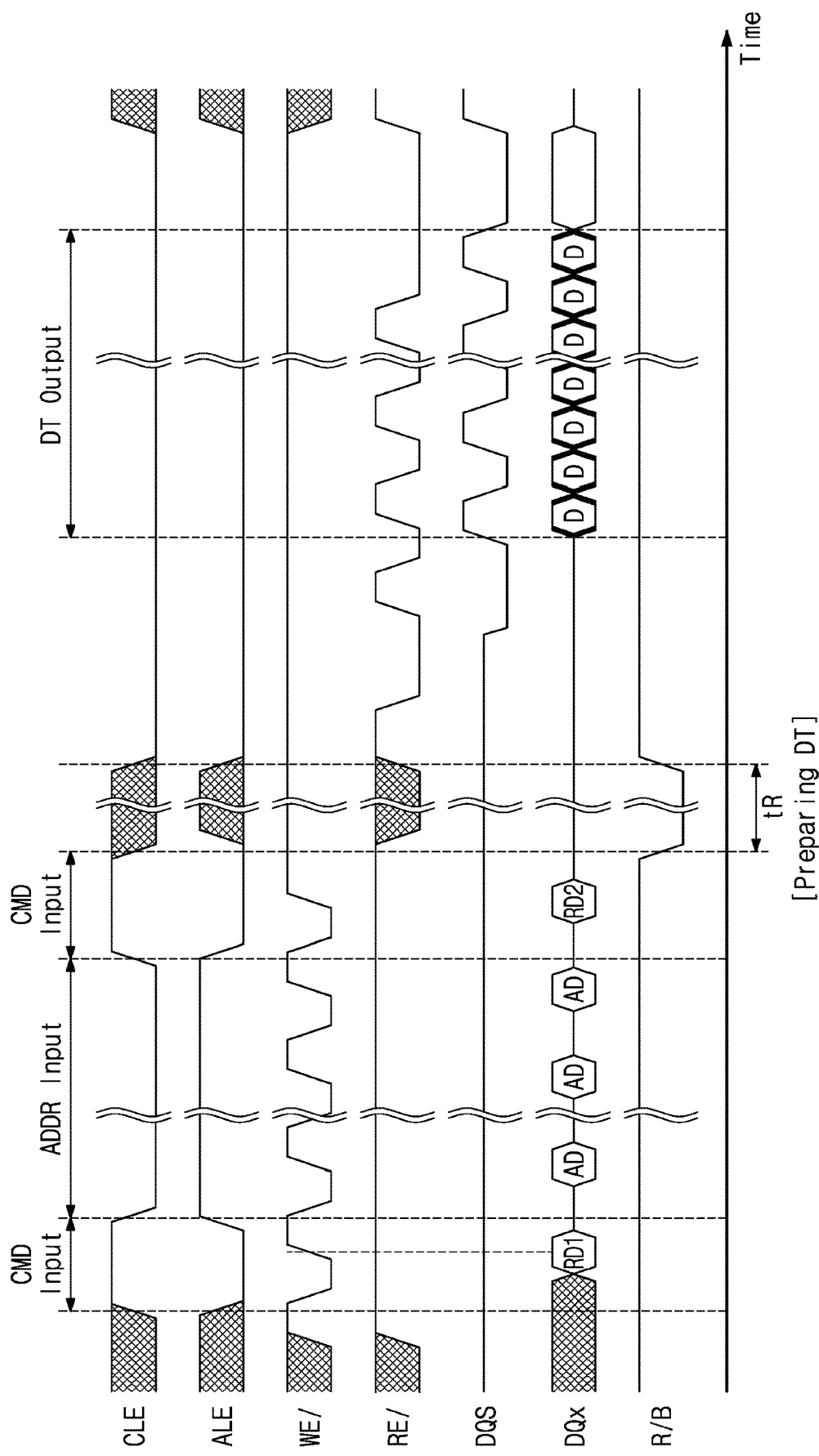
Figure 4C:
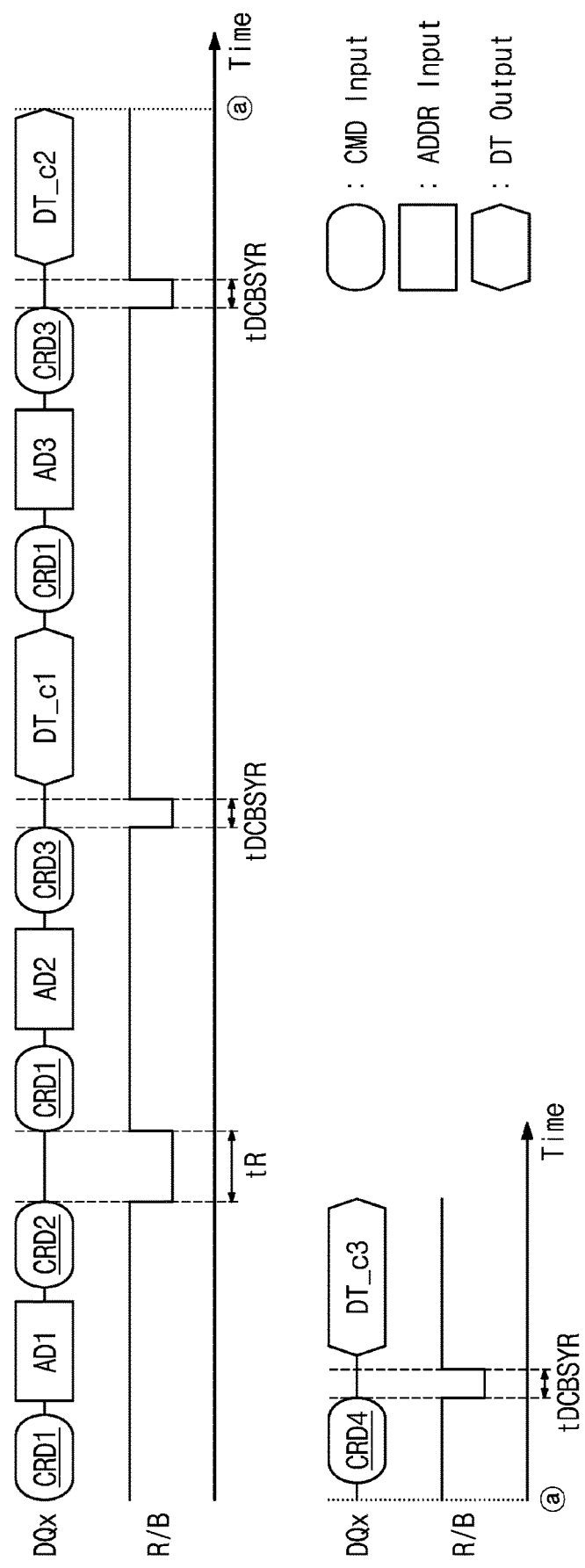

FIGS. 4A to 4C are timing diagrams illustrating operations of a nonvolatile memory device. A page read operation of the nonvolatile memory device 120 will be described with reference to FIG. 4A, a sequential cache read operation of the nonvolatile memory device 120 will be described with reference to FIG. 4B, and a random cache read operation of the nonvolatile memory device 120 will be described with reference to FIG. 4C. For brevity of illustration, in FIGS. 4B and 4C, some control signals (e.g., CLE, ALE, WE/, RE/, and DQS) are omitted. Below, for brevity of illustration, reference numerals of some commands, some addresses, and some data are marked briefly.

Referring to FIGS. 1, 3, and 4A, the nonvolatile memory device 120 may receive a first read command RD1 during a command input interval CMD Input. Afterwards, the nonvolatile memory device 120 may receive addresses AD during an address input interval ADDR Input. The nonvolatile memory device 120 may receive a second read command RD2 during the command input interval CMD Input following the address input interval ADDR Input.

In an exemplary embodiment, the first and second read commands RD1 and RD2 may be a command set (e.g., 00h and 30h) for the page read operation. In an exemplary embodiment, the addresses AD may be received during some periods (or cycles) (e.g., 5 periods (or cycles)) of the write enable signal WE/. As an example, 3 addresses AD may be received within 3 periods as row and page addresses, and 2 addresses AD may be received within another 2 periods as column addresses. A combination of the 3 addresses AD may be used to select one word line and one page in the selected one word line, and a combination of the 2 column addresses AD may be used to select a place where data output are started in the selected page. However, the inventive concept is not limited thereto. The addresses AD refer to a row address or a column address of a physical page which corresponds to a page where read data are stored.

In response to the second read command RD2, the nonvolatile memory device 120 may read data DT corresponding to the received addresses AD from the memory cell array 122. For example, the nonvolatile memory device 120 may read the data DT corresponding to the received addresses AD and may prepare the read data DT in the page buffer circuit 124 or the input/output circuit 125. The read data DT may be prepared during a time period of tR. In an exemplary embodiment, during the time period of tR, the nonvolatile memory device 120 may provide the ready/busy signal R/B of logical low (i.e., a busy state) to the memory controller 110.

In an exemplary embodiment, below, the term "a data preparation operation" or "preparing data" is used for convenience of description. The term "a data preparation operation" or "preparing data" refers to an operation of storing or setting read data stored in a memory cell array to a page buffer circuit (e.g., a cache latch) or an input/output circuit such that the data may be output to the memory controller 110.

After the data preparation operation is completed, the nonvolatile memory device 120 may generate the data strobe signal DQS in response to the read enable signal RE/ received from the memory controller 110 and may output data "D" through the data lines DQx in synchronization with the generated data strobe signal DQS.

In an exemplary embodiment, the data "D" output during the page read operation based on the timing diagram of FIG. 4A (i.e., data output during a data output interval DT Output) may be single page data (e.g., 8 KB or 16 KB). That is, the nonvolatile memory device 120 may output single page data based on the timing diagram illustrated in FIG. 4A.

In an exemplary embodiment, the following Table 1 shows control signals in each of the command input interval CMD Input, the address input interval ADDR Input, and the data output interval DT Output.

TABLE 1

|  | CLE | ALE | RE/ | WE/ | DQS |
|---|---|---|---|---|---|
| CMD Input | H | L | H | ↑ | X |
| ADDR Input | L | H | H | ↑ | X |
| DT Output | L | L | ↓↑ | H | ↓↑ |

Referring to Table 1, in the command input interval CMD Input, the command latch enable signal CLE and the read enable signal RE/ are logical high "H", and the address latch enable signal ALE is logical low "L". During the command input interval CMD Input, the nonvolatile memory device 120 latches a signal received through the data lines DQx as the command CMD at a rising edge ↑ of the write enable signal WE/. In the address input interval ADDR Input, the address latch enable signal ALE and the read enable signal RE/ are logical high "H", and the command latch enable signal CLE is logical low "L". During the address input interval ADDR Input, the nonvolatile memory device 120 latches a signal received through the data lines DQx as the address ADDR at a rising edge ↑ of the write enable signal WE/. In this case, an address may be information corresponding to a page where read data are stored.

In the data output interval DT Output, the command latch enable signal CLE and the address latch enable signal ALE are logical low "L", and the write enable signal WE/ is logical high "H". In the data output interval DT Output, the nonvolatile memory device 120 generates the data strobe signal DQS based on the read enable signal RE/ and outputs the data DT through the data lines DQx in synchronization with a rising edge ↑ and a falling edge ↓ of the data strobe signal DQS.

In an exemplary embodiment, signal levels of Table 1 are an example, and the inventive concept is not limited thereto. In the following drawings, control signals (e.g., CLE, ALE, RE/, and WE/) are omitted for brevity of illustration. However, control signals may be controlled as illustrated in Table 1, in the command input interval CMD Input, the address input interval ADDR Input, and the data output interval DT Output.

Referring to FIGS. 1, 3, and 4B, the nonvolatile memory device 120 may perform the sequential cache read operation based on the timing diagram of FIG. 4B. For example, the nonvolatile memory device 120 may receive a first cache read command CRD1 during the command input interval CMD Input. Afterwards, the nonvolatile memory device 120 may receive a first address AD1 during the address input interval ADDR Input. Then, the nonvolatile memory device 120 may receive a second cache read command CRD2 during the command input interval CMD Input. During a time period of tR, the nonvolatile memory device 120 may read data of a first page corresponding to the first address AD1 as first cache data DT_c1 in response to the second cache read command CRD2.

Then, the nonvolatile memory device 120 may receive a third cache read command CRD3 during the command input interval CMD Input. During a time period of tDCBSYR, the nonvolatile memory device 120 may prepare the previously read first cache data DT_c1 in response to the third cache read command CRD3.

After the time of tDCBSYR, the nonvolatile memory device 120 may output the first cache data DT_c1 through the data lines DQx. At the same time, the nonvolatile memory device 120 reads data of a second page different from the first page, as second cache data DT_c2.

Afterwards, the nonvolatile memory device 120 may further receive the third cache read command CRD3 during the command input interval CMD Input. During a time period of tDCBSYR, the nonvolatile memory device 120 may prepare the previously read second cache data DT_c2 in response to the third cache read command CRD3, and may output the second cache data DT_c2 through the data lines DQx. At the same time, the nonvolatile memory device 120 reads data of another page, for example, a third page, as third cache data DT_c3.

Afterwards, the nonvolatile memory device 120 may receive a fourth cache read command CRD4 during the command input interval CMD Input, may prepare the third cache data DT_c3 in response to the fourth cache read command CRD4, and may output the prepared third cache data DT_c3 through the data lines DQx. In an exemplary embodiment, each of the first to third cache data DT_c1 to DT_c3 may be single page data.

Referring to FIGS. 1, 3, and 4C, the nonvolatile memory device 120 may perform the random cache read operation based on the timing diagram of FIG. 4C. For example, the nonvolatile memory device 120 may sequentially receive a first cache read command CRD1, a first address AD1, and a second cache read command CRD2. Afterwards, during a time period of tR, the nonvolatile memory device 120 may read data of a page corresponding to the first address AD1 as first cache data DT_c1.

Then, the nonvolatile memory device 120 may sequentially receive the first cache read command CRD1, a second address AD2, and a third cache read command CRD3. In response to the third cache read command CRD3, the nonvolatile memory device 120 may prepare the previously read first cache data DT_c1 during a time period of tDCBSYR and may output the first cache data DT_c1 through the data lines DQx. At the same time, the nonvolatile memory device 120 may read data of a page corresponding to the second address AD2, as second cache data DT_c2.

Then, the nonvolatile memory device 120 may sequentially receive the first cache read command CRD1, a third address AD3, and the third cache read command CRD3. In response to the third cache read command CRD3, the nonvolatile memory device 120 may prepare the previously read second cache data DT_c2 during the time period of tDCBSYR and may output the second cache data DT_c2 through the data lines DQx. At the same time, the nonvolatile memory device 120 may read data of a page corresponding to a third address AD3, as third cache data DT_c3.

Afterwards, the nonvolatile memory device 120 may receive a fourth cache read command CRD4, may prepare the previously read third cache data DT_c3 in response to the fourth cache read command CRD4, and may output the prepared third cache data DT_c3 through the data lines DQx.

As described above, for the nonvolatile memory device 120 to perform the sequential cache read operation or the random cache read operation, a command or an address invoke of a page unit is required from the memory controller 110. For example, as illustrated in FIG. 4B or 4C, a page-based command or a page-based address is received from the memory controller 110 between the transfers of the first to third cache data DT_c1 to DT_c3. That is, in a conventional sequential read operation or a conventional random cache read operation, a plurality of cache data are discontinuously output through the data lines DQx.

In example embodiments, with regard to the sequential read operation of the nonvolatile memory device 120, an invoke or an issue of a separate command or an address of a page unit is not used while outputting a plurality of sequential data. For example, the nonvolatile memory device 120 may receive signals such as a set of sequential read command and sequential read information and may output a plurality of sequential data based on the received signals. In this case, the plurality of sequential data may be a plurality of data respectively corresponding to a plurality of pages. A sequential read operation of a nonvolatile memory device according to an embodiment of the inventive concept will be described with reference to the following drawings.

Figure 5A:
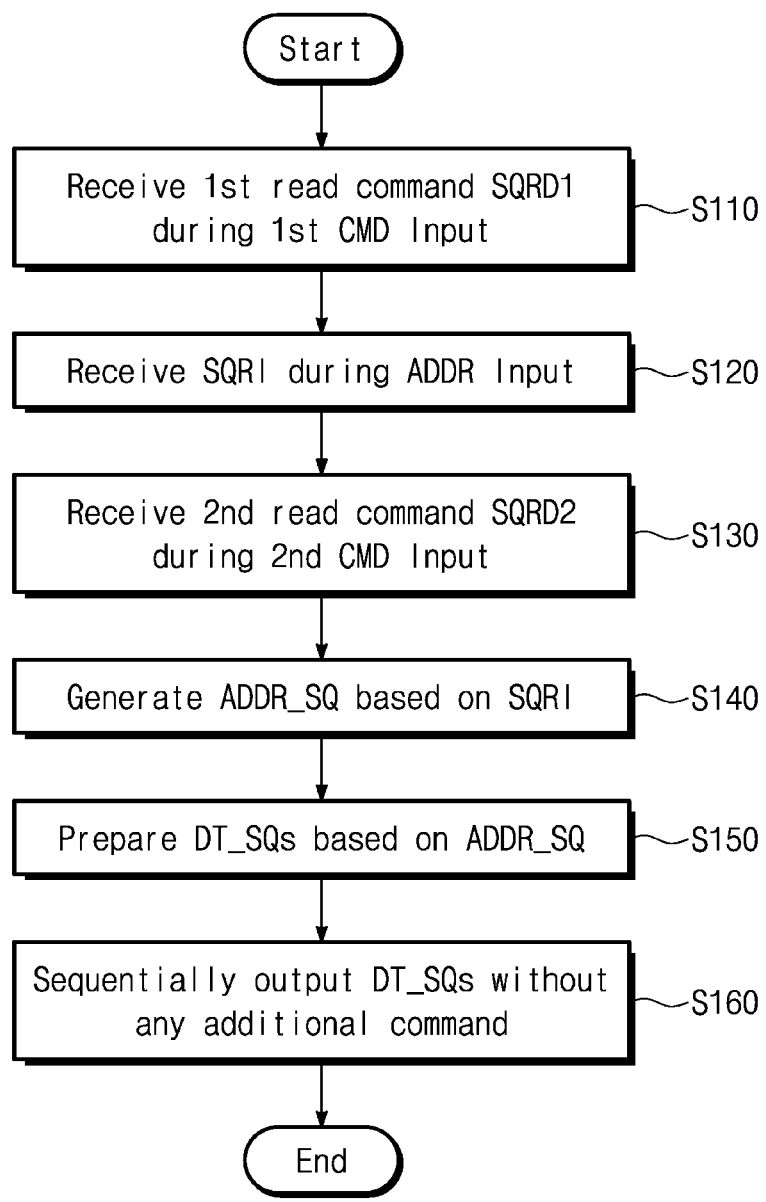
FIG. 5A is a flowchart illustrating a sequential read operation of a nonvolatile memory device of FIG. 1 according to example embodiments.

FIG. 5A is a flowchart illustrating a sequential read operation of a nonvolatile memory device of FIG. 1 according to example embodiments. Referring to FIGS. 1, 3, and 5A, in operation S110, the nonvolatile memory device 120 may receive a first read command SQRD1 (e.g., a first advanced read command) during a first command input interval CMD Input.

In operation S120, the nonvolatile memory device 120 may receive sequential read information SQRI during an address input interval ADDR Input. In an exemplary embodiment, the sequential read information SQRI may include information about a sequential read mode, information about a size of sequential data, the number of sequential data, etc.

In operation S130, the nonvolatile memory device 120 may receive a second read command SQRD2 (e.g., a second advanced read command) during a second command input interval CMD Input. In an exemplary embodiment, the first and second read commands SQRD1 and SQRD2 may be a command set for the sequential read operation (e.g., the advanced read operation).

In operation S140, the nonvolatile memory device 120 may generate a plurality of addresses ADDR_SQ based on the sequential read information SQRI. For example, the sequential address generator 121 of the nonvolatile memory device 120 may generate a plurality of addresses ADDR_SQ (e.g., a plurality of sequential addresses or a plurality of random addresses) based on an address generation manner or an algorithm corresponding to the sequential read mode of the sequential read information SQRI.

In operation S150, the nonvolatile memory device 120 may prepare a plurality of sequential data DT_SQs based on the plurality of addresses ADDR_SQ. For example, the plurality of sequential data DT_SQs may be prepared in the page buffer circuit 124 or in the input/output circuit 125. In operation S160, the nonvolatile memory device 120 may output the plurality of sequential data DT_SQs without a separate command.

In an exemplary embodiment, the nonvolatile memory device 120 may perform operation S150 and operation S160 in parallel (or at the same time). For example, in the case where the sequential address generator 121 generates first to n-th addresses ADDR_SQ1 to ADDR_SQn, first, the nonvolatile memory device 120 may prepare first sequential data DT_SQ1 corresponding to the first address ADDR_SQ1. Afterwards, the nonvolatile memory device 120 may prepare second sequential data DT_SQ2 corresponding to the second address ADDR_SQ2 while outputting the first sequential data DT_SQ1. Afterwards, the nonvolatile memory device 120 may prepare third sequential data DT_SQ3 corresponding to the third address ADDR_SQ3 while outputting the second sequential data DT_SQ2. The nonvolatile memory device 120 may repeatedly perform the above-described operations until n-th sequential data DT_SQn corresponding to the n-th address ADDR_SQn are output.

As described above, the nonvolatile memory device 120 according to the inventive concept may generate the plurality of addresses ADDR_SQ based on the sequential read information SQRI received during the address input interval ADDR Input and may output a plurality of sequential data DT_SQs based on the plurality of addresses ADDR_SQ thus generated. In this case, since an invoke for a page-based command or address is not used while outputting the plurality of sequential data DT_SQs, a speed at which data are output may be improved.

Figure 5B:
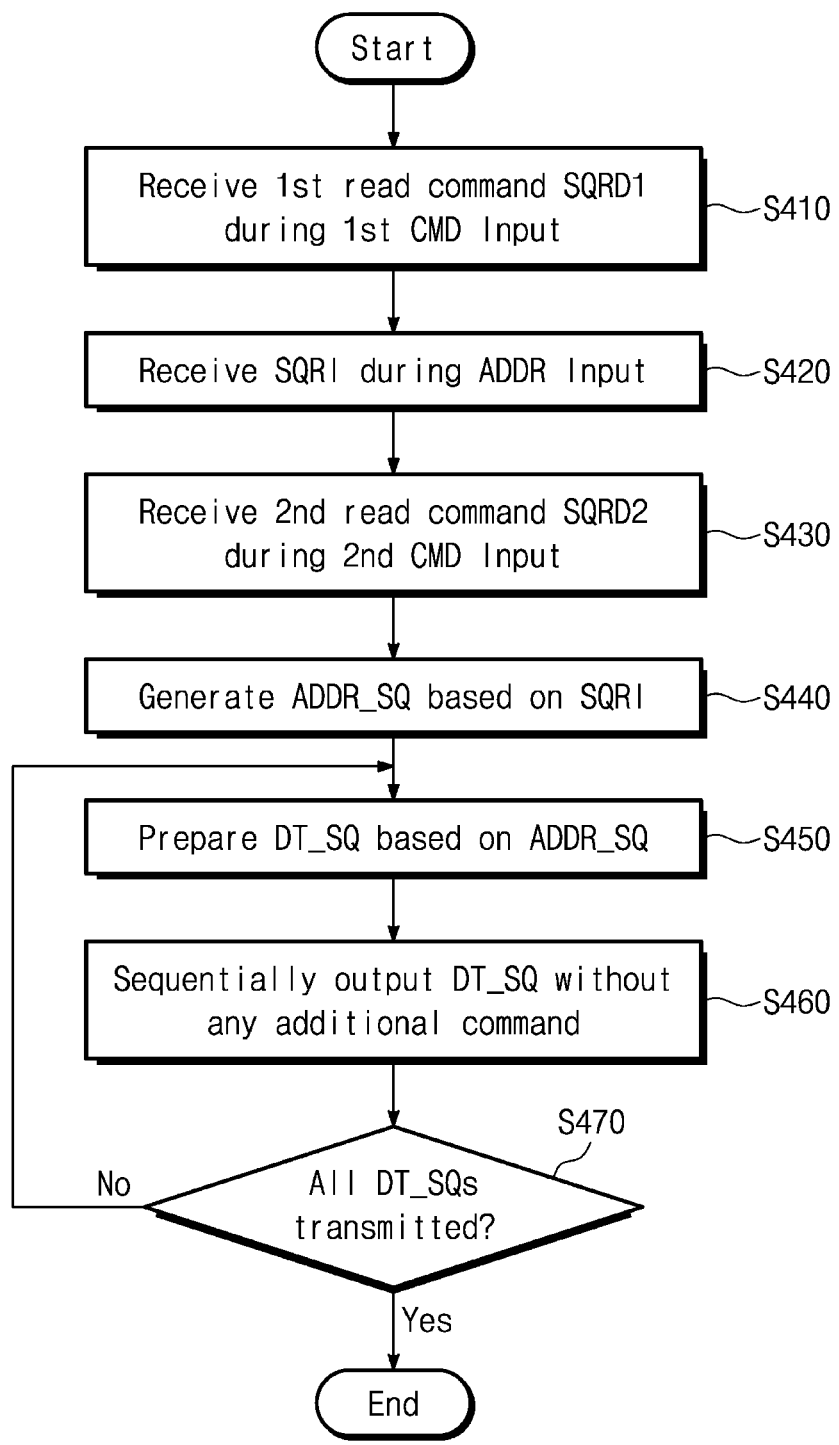
FIG. 5B is a flowchart illustrating a sequential read operation of a nonvolatile memory device of FIG. 1 according to other example embodiments.

FIG. 5B is a flowchart illustrating a sequential read operation of a nonvolatile memory device of FIG. 1 according to example embodiments. Referring to FIGS. 1, 3, and 5B, the nonvolatile memory device 120 may perform operation S410 to operation S470. Operation S410 to operation S440 are similar to operation S110 to operation S140 of FIG. 5A, and thus, a detailed description thereof will not be repeated here.

In operation S450, the nonvolatile memory device 120 may prepare first sequential data DT_SQ based on a first address ADDR_SQ. For example, the first sequential data DT_SQ may be prepared in the page buffer circuit 124 or in the input/output circuit 125. In operation S460, the nonvolatile memory device 120 may sequentially output the first sequential data DT_SQ without any additional read command.

In operation S470, the nonvolatile memory device 120 may determine whether all sequential data DT_SQs based on the sequential read information SQRI are transmitted.

In the case where all the sequential data DT_SQs are not yet transmitted to the memory controller 110 (i.e., in the case where sequential data DT_SQ not transmitted to the memory controller 110 exist), the nonvolatile memory device 120 may repeatedly perform operations S450 and S460. For example, in operation S450, the nonvolatile memory device 120 may prepare second sequential data DT_SQ based on a second address ADDR_SQ. For example, the second sequential data DT_SQ may be prepared in the page buffer circuit 124 or in the input/output circuit 125. In operation S460, the nonvolatile memory device 120 may sequentially output the second sequential data DT_SQ after outputting the first sequential data DT_SQ without any additional read command.

Figure 6:
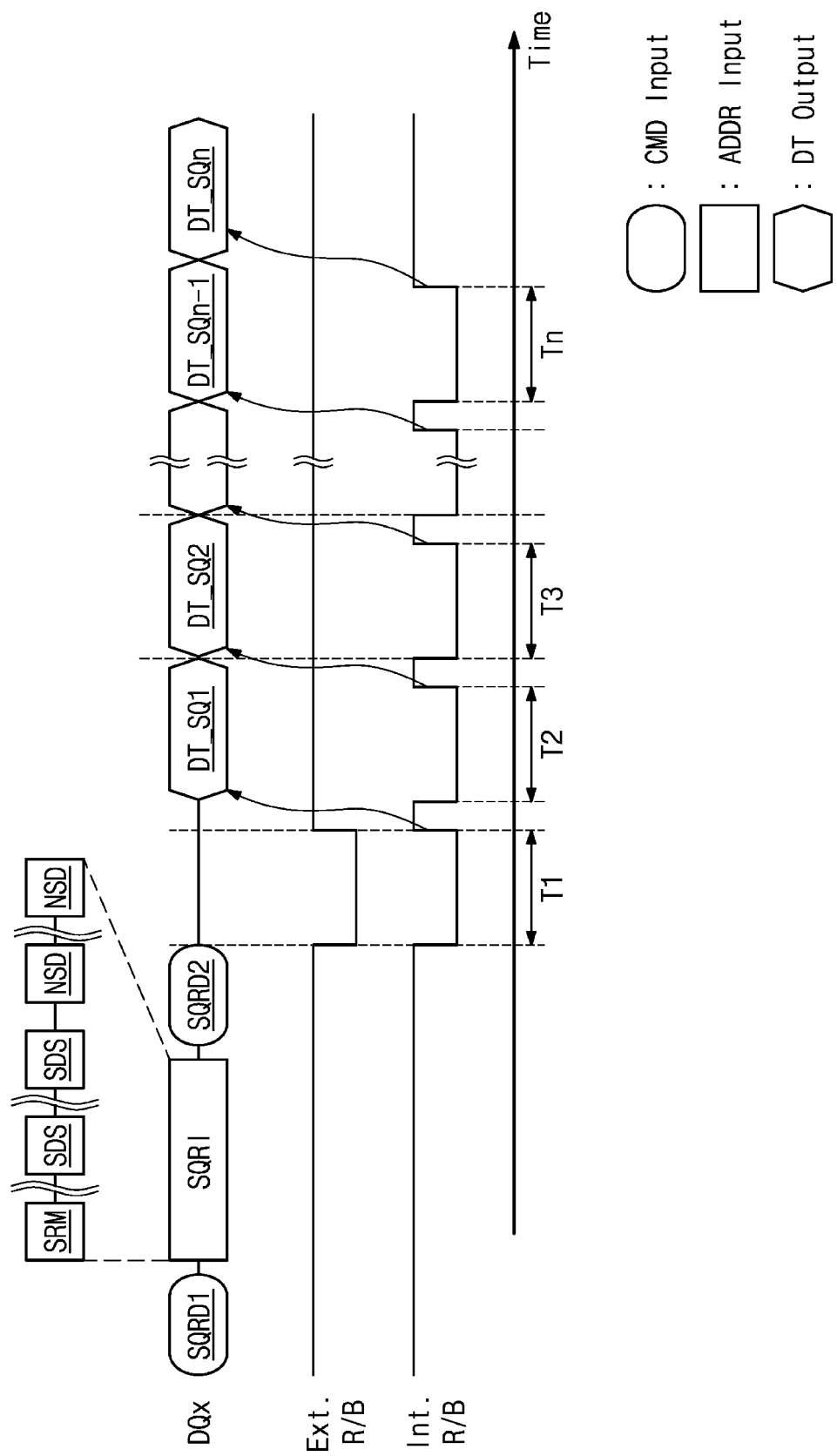
FIG. 6 is a timing diagram illustrating an operation of a nonvolatile memory device according to the flowchart of FIGS. 5A and 5B according to example embodiments.

FIG. 6 is a timing diagram illustrating an operation of a nonvolatile memory device according to the flowchart of FIGS. 5A and 5B. As in the above description, some control signals (e.g., CLE, ALE, RE/, WE/, and DQS) are omitted for brevity of illustration. Below, control signals are controlled as illustrated in Table 1, in the command input interval CMD Input, the address input interval ADDR Input, and the data output interval DT Output.

Referring to FIGS. 1, 5, and 6, the nonvolatile memory device 120 may receive the first sequential read command SQRD1 through the data lines DQx during the first command input interval CMD Input.

Afterwards, the nonvolatile memory device 120 may receive the sequential read information SQRI through the data lines DQx during the address input interval ADDR Input. In an exemplary embodiment, in the page read operation, the sequential cache read operation, and the random cache read operation described with reference to FIGS. 4A to 4C, a physical address corresponding to read data is received during the address input interval ADDR Input. However, in the advanced read operation of the nonvolatile memory device 120 according to the inventive concept, the sequential read information SQRI is received during the address input interval ADDR Input. In this case, the sequential read information SQRI may be information different from a general address ADDR.

For example, the sequential read information SQRI may include pieces of information about a sequential read mode SRM, a sequential data size SDS, and the number of sequential data NSD. The information included in the sequential read information SQRI may be received during a plurality of cycles of the write enable signal WE/. For example, as described with reference to FIG. 4A, in the address input interval ADDR Input, the write enable signal WE/ may toggle as much as a plurality of cycles (e.g., n times, with n being an integer greater than 1). As an example, one cycle (or, one period) may be the same as a width of one rising pulse or a width of one falling pulse. Various information (e.g., the sequential read mode SRM, the sequential data size SDS, and the number of sequential data NSD) included in the sequential read information SQRI may be provided in synchronization with a rising or a falling edge of the write enable signal WE/ toggling during a plurality of cycles.

Afterwards, the nonvolatile memory device 120 may receive the second sequential read command SQRD2 during the second command input interval CMD Input. The nonvolatile memory device 120 may perform a sequential data preparation operation in response to the second sequential read command SQRD2. For example, as described above, the sequential address generator 121 of the nonvolatile memory device 120 may generate a plurality of addresses ADDR_SQ based on the sequential read information SQRI.

The nonvolatile memory device 120 may prepare a plurality of sequential data DT_SQs based on the plurality of addresses ADDR_SQ thus generated.

For example, as described with reference to FIG. 6, the nonvolatile memory device 120 may prepare the first sequential data DT_SQ1 corresponding to the first address ADDR_SQ1 during a first time period T1. While the first sequential data DT_SQ1 are prepared, an external ready/busy signal Ext. R/B and an internal ready/busy signal Int. R/B may maintain a low state (i.e., a busy state).

In an embodiment, the external ready/busy signal Ext. R/B may be a signal informing the memory controller 110 of an operation state of the nonvolatile memory device 120, and the internal ready/busy signal Int. R/B may be a signal for informing an internal operation inside the nonvolatile memory device 120. For example, even though the internal ready/busy signal Int. R/B is in a low state (i.e., a busy state), when the external ready/busy signal Ext. R/B is in a high state (i.e., a ready state), the nonvolatile memory device 120 may provide the sequential data DT_SQ to the memory controller 110 through the data lines DQx.

When the first sequential data DT_SQ1 are prepared, the external ready/busy signal Ext. R/B and the internal ready/busy signal Int. R/B may transition to the high state (i.e., a ready state). Afterwards, the nonvolatile memory device 120 may output the first sequential data DT_SQ1 under control of the memory controller 110. While the first sequential data DT_SQ1 are output, the nonvolatile memory device 120 may prepare the second sequential data DT_SQ2 corresponding to the second address ADRR_SQ2 during a second time period T2. In this case, the external ready/busy signal Ext. R/B may maintain the high state (i.e., a ready state) and the internal ready/busy signal Int. R/B may maintain the low state (i.e., a busy state) during the second time period T2.

In the case where the first sequential data DT_SQ1 are completely transmitted and the second sequential data DT_SQ2 are completely prepared, the nonvolatile memory device 120 may output the second sequential data DT_SQ2 under control of the memory controller 110. Likewise, while the second sequential data DT_SQ2 are output, the nonvolatile memory device 120 may prepare the third sequential data DT_SQ3 corresponding to the third address ADDR_SQ3. The nonvolatile memory device 120 may repeatedly perform the above-described operations until the n-th sequential data DT_SQn are output. The first to n-th sequential data DT_SQ1 to DT_SQn may be output "sequentially or continuously" by repeatedly performing the above-described operations. For example, while the first to n-th sequential data DT_SQ1 to DT_SQn are continuously output, the nonvolatile memory device 120 does not receive an additional sequential read command from the memory controller 110.

In an exemplary embodiment, that the first to n-th sequential data DT_SQ1 to DT_SQn are output "sequentially or continuously" means that any other command or address is not received through the data lines DQx from the memory controller 110 during outputting the first to n-th sequential data DT_SQ1 to DT_SQn. For example, after the first sequential data DT_SQ1 are output, the second sequential data DT_SQ2 may be output without a separate command or a separate address from the memory controller 110.

For example, in the sequential read operation, the nonvolatile memory device 120 according to an embodiment of the inventive concept may not receive a separate command through the data lines DQx from the memory controller 110 while outputting the first to n-th sequential data DT_SQ1 to DT_SQn. For example, after receiving the first sequential read command SQRD1, the sequential read information SQRI, and the second sequential read command SQRD2, the nonvolatile memory device 120 may not receive a separate command (e.g., a cache read command described with reference to FIGS. 4B and 5) while outputting a plurality of sequential data DT_SQs. As such, since a separate command is not used while outputting the plurality of sequential data DT_SQs, a speed at which the nonvolatile memory device 120 outputs data may be improved.

In an exemplary embodiment, the memory controller 110 may provide the read enable signal RE/ to the nonvolatile memory device 120 in response to the external ready/busy signal Ext. R/B of the high state (i.e., a ready state). The nonvolatile memory device 120 may output the plurality of sequential data DT_SQ1 to DT_SQn in response to the read enable signal RE/ received from the memory controller 110.

In example embodiments, the first to n-th addresses ADDR_SQ1 to ADDR_SQn may be sequentially or randomly generated based on the sequential read information SQRI.

FIGS. 7A to 7D are exemplary diagrams for describing various sequential read modes of a nonvolatile memory device of FIG. 1 according to example embodiments. Some of various sequential read modes of the nonvolatile memory device according to exemplary embodiments of the inventive concept will be described with reference to FIGS. 7A to 7D, but the inventive concept is not limited thereto.

For brevity of illustration and for convenience of description, it is assumed that the memory cell array 122 includes a first plane PL1 and a second plane PL2, the first plane PL1 includes memory blocks BLK11 and BLK12, the second plane PL2 includes memory blocks BLK21 and BLK22, and each of the memory blocks BLK11, BLK12, BLK21, and BLK22 includes six pages. It is assumed that each of the six pages is a physical page indicating a group of data stored in memory cells connected to one word line. However, the inventive concept is not limited thereto.

Figure 7A:
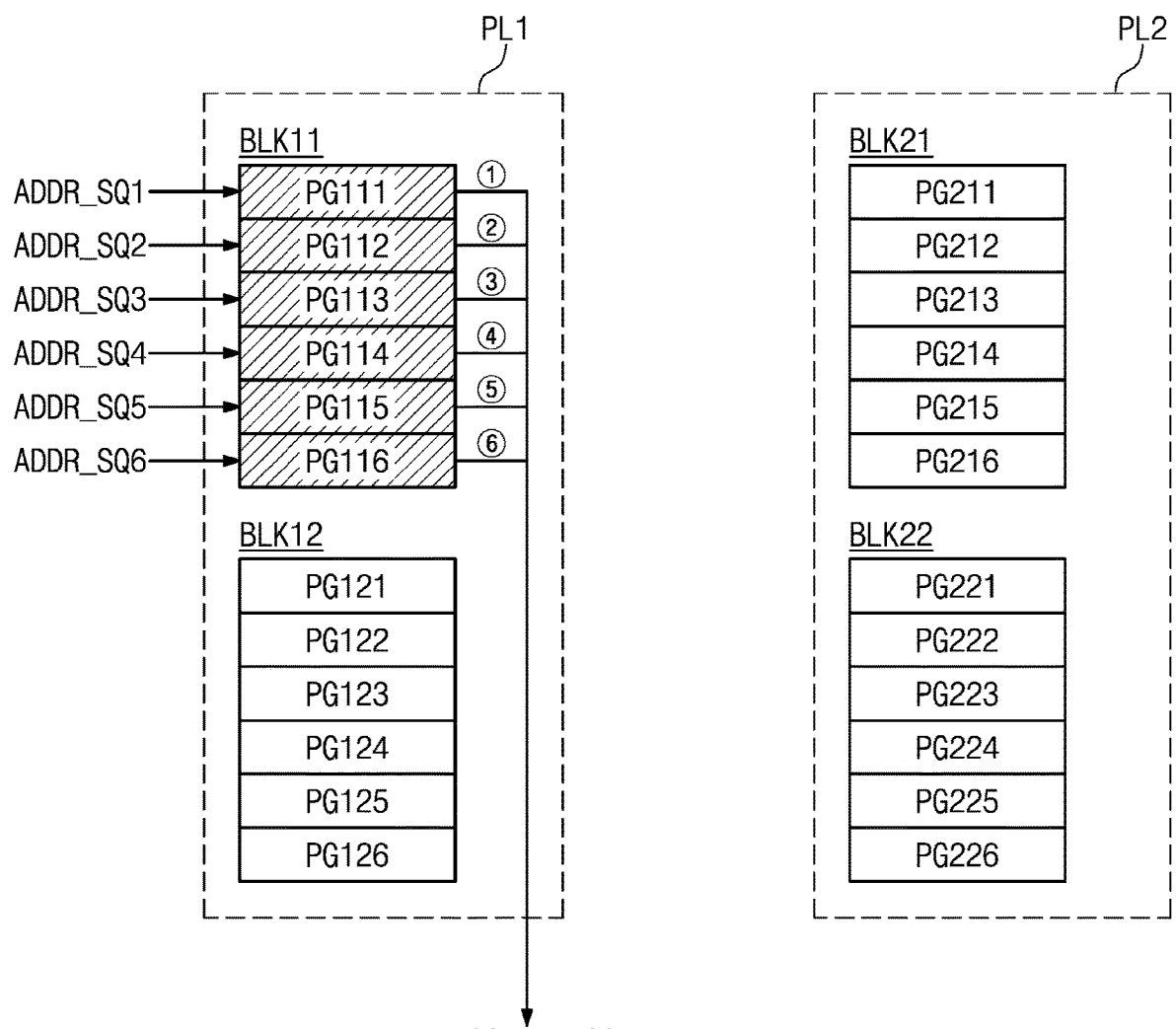
FIGS. 7A to 7D are diagrams for describing various sequential read modes of a nonvolatile memory device of FIG. 1 according to example embodiments.

Referring to FIGS. 1, 3, and 7A, in the case where information about the sequential read mode SRM included in the sequential read information SQRI received from the memory controller 110 indicates a first sequential read mode SRM_1, as illustrate in FIG. 7A, the sequential address generator 121 may generate a plurality of addresses ADDR_SQ such that a plurality of sequential data DT_SQ1 to DT_SQ6 are output. For example, the first sequential read mode SRM_1 may indicate an operation of reading all pages of a particular memory block (e.g., the memory block BLK11 of the first plane PL1). In this case, the sequential address generator 121 may generate addresses respectively corresponding to pages PG111 to PG116 of the memory block BLK11 of the first plane PL1 as the plurality of addresses ADDR_SQ.

In detail, the sequential address generator 121 may generate an address for the first page PG111 of the memory block BLK11 as the first address ADDR_SQ1, and data of the first page PG111 corresponding to the first address ADDR_SQ1 may be output as first sequential data DT_SQ1 (①of FIG. 7A). The sequential address generator 121 may generate an address for the second page PG112 of the memory block BLK11 as the second address ADDR_SQ2, and data of the second page PG112 corresponding to the second address ADDR_SQ2 may be output as second sequential data DT_SQ2 (② of FIG. 7A). Likewise, the sequential address generator 121 may generate addresses respectively corresponding to the third to sixth pages PG113 to PG116 of the memory block BLK11 as the third to sixth addresses ADDR_SQ3 to ADDR_SQ6, and data of the third to sixth pages PG113 to PG116 corresponding to the third to sixth addresses ADDR_SQ3 to ADDR_SQ6 may be output as third to sixth sequential data DT_SQ3 to DT_SQ6 (③ to ⑥ of FIG. 7A).

In example embodiments, each sequential data of the first to sixth sequential data DT_SQ1 to DT_SQ6 may be output from memory cells connected to at least one word line from among a plurality of word lines. As an example, each sequential data of the first to sixth sequential data DT_SQ1 to DT_SQ6 may be output from memory cells connected to first to sixth word lines of the plurality of word lines, respectively. As another example, all of the sequential data of the first to sixth sequential data DT_SQ1 to DT_SQ6 may be output from memory cells connected to the same word line, for example, a first word line.

In example embodiments, the first to sixth sequential addresses ADDR_SQ1 to ADDR_SQ6 may be sequentially generated. For example, the first to sixth addresses ADDR_SQ1 to ADDR_SQ6 may be sequential addresses.

Figure 7B:
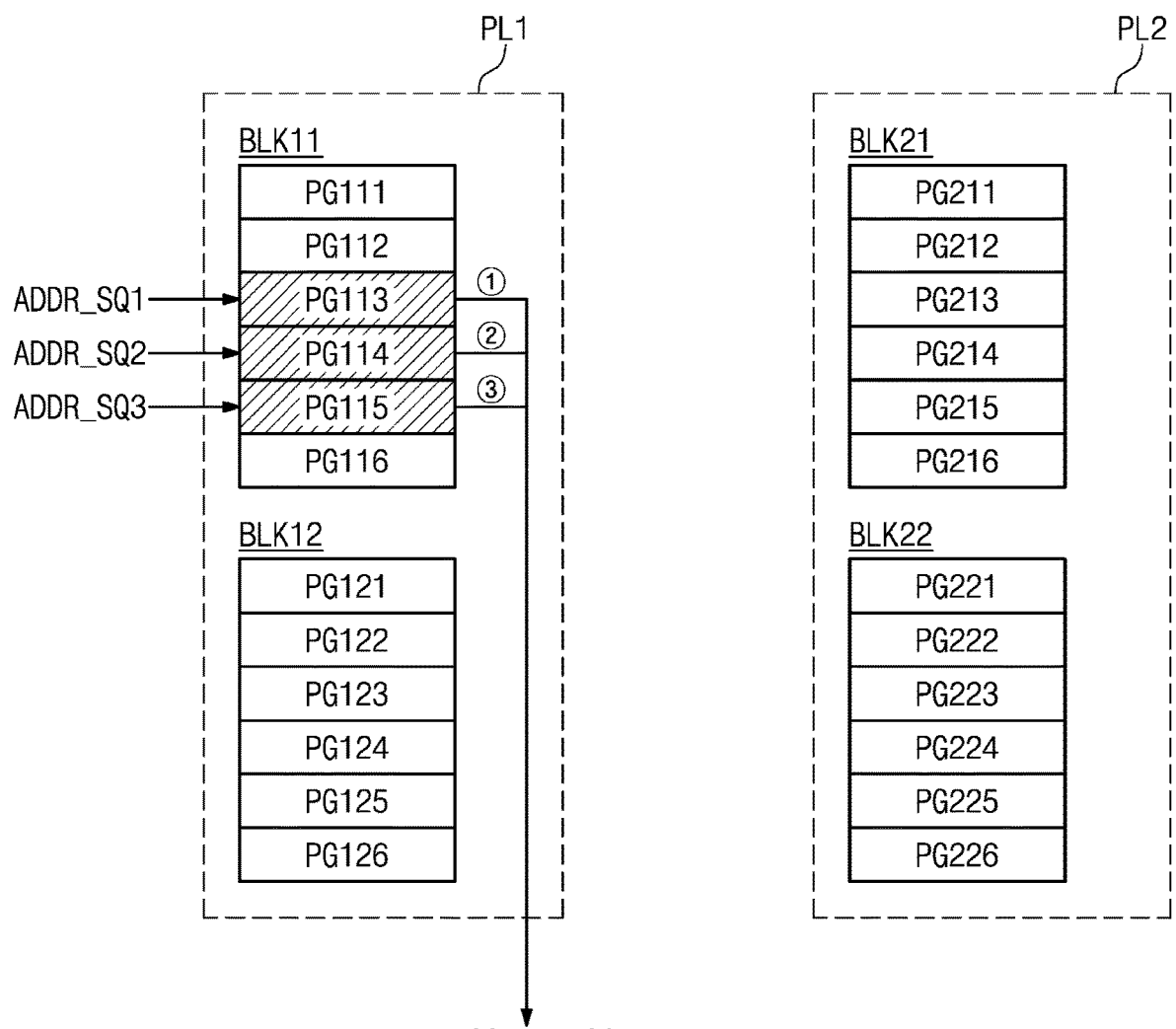

In the case where information about the sequential read mode SRM included in the sequential read information SQRI received from the memory controller 110 indicates a second sequential read mode SRM_2, as illustrate in FIG. 7B, the sequential address generator 121 may generate a plurality of addresses ADDR_SQ such that a plurality of sequential data DT_SQ1 to DT_SQ3 are output. For example, the second sequential read mode SRM_2 may indicate an operation of reading particular pages of a particular memory block. In detail, in the second sequential read mode SRM_2, the sequential address generator 121 may generate addresses for particular pages PG113, PG114, and PG115 of a particular memory block (e.g., the memory block BLK11) as the first to third addresses ADDR_SQ1 and ADDR_SQ3, and data of the pages PG113, PG114, and PG115 corresponding to the first to third addresses ADDR_SQ1 and ADDR_SQ3 may be output as first to third sequential data DT_SQ1 to DT_SQ3 (① to ③ of FIG. 7B).

In example embodiments, each sequential data of the first to third sequential data DT_SQ1 to DT_SQ3 may be output from memory cells connected to at least one selected word line from among a plurality of word lines. As an example, each sequential data of the first to third sequential data DT_SQ1 to DT_SQ3 may be output from memory cells connected to first to third word lines of the plurality of word lines, respectively. As another example, all of the sequential data of the first to third sequential data DT_SQ1 to DT_SQ3 may be output from memory cells connected to the same word line.

In example embodiments, the first to third sequential addresses ADDR_SQ1 to ADDR_SQ3 may be sequentially generated. For example, the first to third addresses ADDR_SQ1 to ADDR_SQ3 may be sequential addresses.

Figure 7C:
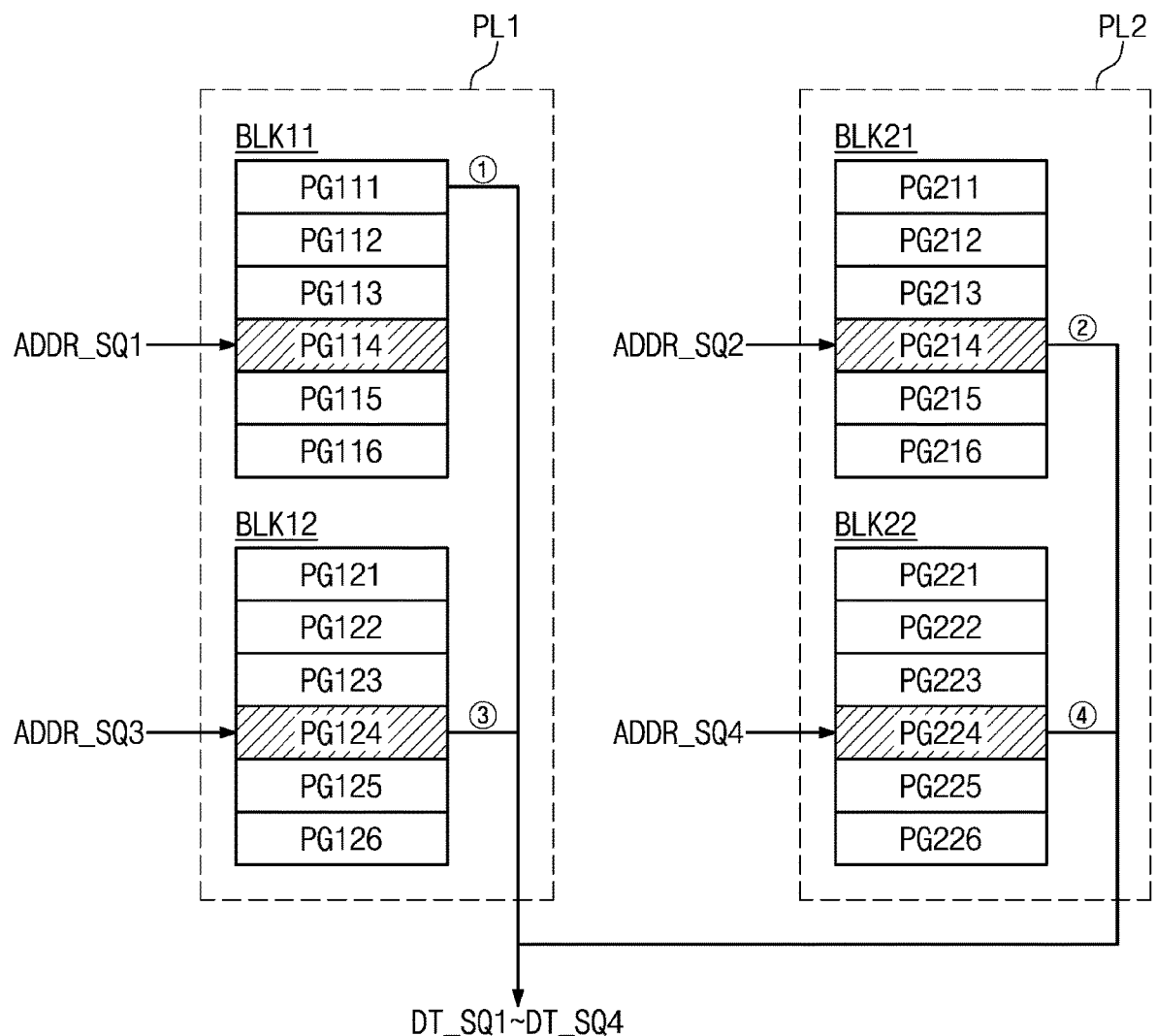

In the case where information about the sequential read mode SRM included in the sequential read information SQRI received from the memory controller 110 indicates a third sequential read mode SRM_3, as illustrate in FIG. 7C, the sequential address generator 121 may generate a plurality of addresses ADDR_SQ such that a plurality of sequential data DT_SQ1 to DT_SQ4 are output. For example, the third sequential read mode SRM_3 may indicate an operation of reading a particular page (e.g., a fourth page) of each of a plurality of memory blocks. In detail, in the third sequential read mode SRM_3, the sequential address generator 121 may generate addresses of fourth pages PG114, PG214, PG124, and PG224 of the memory blocks BLK11, BLK21, BLK12, and BLK22 as first to fourth addresses ADDR_SQ1 to ADDR_SQ4. Data of the fourth pages PG114, PG214, PG124, and PG224 respectively corresponding to first to fourth addresses ADDR_SQ1 to ADDR_SQ4 may be output as first to fourth sequential data DT_SQ1 to DT_SQ4 (① to ④ of FIG. 7C).

In this case, the first to fourth addresses ADDR_SQ1 to ADDR_SQ4 may be randomly generated.

Figure 7D:
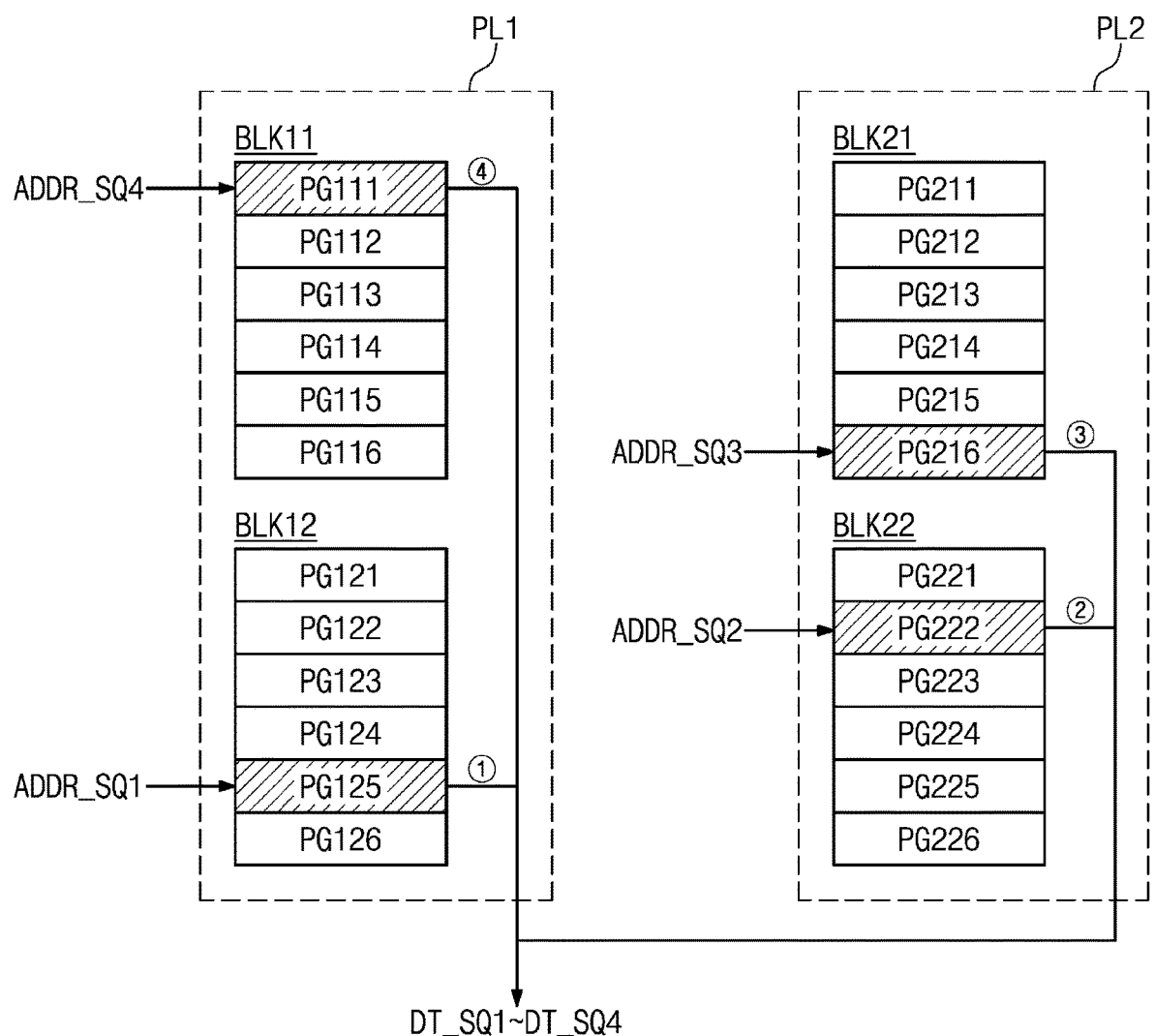

In the case where information about the sequential read mode SRM included in the sequential read information SQRI received from the memory controller 110 indicates a fourth sequential read mode SRM_4, as illustrate in FIG. 7D, the sequential address generator 121 may generate a plurality of addresses ADDR_SQ such that a plurality of sequential data DT_SQ1 to DT_SQ4 are output. For example, the fourth sequential read mode SRM_4 may indicate an operation of reading pages which are determined in advance by a user or any other algorithm.

In detail, in the fourth sequential read mode SRM_4, the sequential address generator 121 may generate addresses of pages PG125, PG222, PG216, and PG111 of the memory blocks BLK12, BLK22, BLK21, and BLK11 as first to fourth addresses ADDR_SQ1 to ADDR_SQ4. Data of the pages PG125, PG222, PG216, and PG111 respectively corresponding to the first to fourth sequential addresses ADDR_SQ1 to ADDR_SQ4 may be continuously output as first to fourth sequential data DT_SQ1 to DT_SQ4 (① to ④ of FIG. 7D).

In example embodiments, the first to fourth addresses ADDR_SQ1 to ADDR_SQ4 may be randomly generated. For example, the first to fourth addresses ADDR_SQ1 to ADDR_SQ4 may be random addresses.

As described above, a way or algorithm to generate a plurality of sequential addresses or a plurality of random addresses may vary with a sequential read mode. The above embodiments associated with the first to fourth sequential read modes are for describing the inventive concept easily, and the inventive concept is not limited thereto. For example, any other sequential read modes may be applied to the inventive concept.

Figure 8:
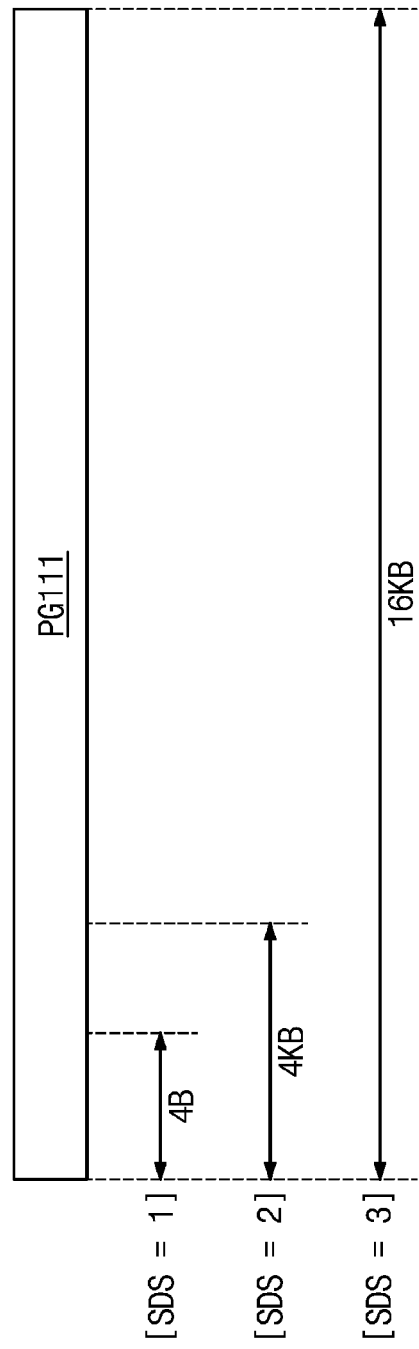
FIG. 8 is a diagram for describing information about the size of sequential data illustrated in FIG. 6 according to example embodiments.

FIG. 8 is a diagram for describing information about the sequential data size SDS illustrated in FIG. 6 according to example embodiments. For convenience of description, information SDS (sequential data size) about the size of sequential data will be described with reference to one page. Also, for convenience of description, it is assumed that one page includes 16 KB data. However, the inventive concept is not limited thereto.

Referring to FIGS. 1, 6, and 8, one sequential data DT_SQ which is output corresponding to a sequential address ADDR_SQ may be determined depending on the information SDS about the size of sequential data included in the sequential read information SQRI. For example, in the case where the information SDS about the size of sequential data included in the sequential read information SQRI is a first value (i.e., SDS=1), only 4B data of data read from a page corresponding to the sequential address ADDR_SQ may be output as the sequential data DT_SQ. Alternatively, in the case where the information SDS about the size of sequential data included in the sequential read information SQRI is a second value (i.e., SDS=2), only 4 KB data of data read from the page corresponding to the sequential address ADDR_SQ may be output as the sequential data DT_SQ. Alternatively, in the case where the information SDS about the size of sequential data included in the sequential read information SQRI is a third value (i.e., SDS=3), all data (i.e., 16 KB data) read from the page corresponding to the sequential address ADDR_SQ may be output as the sequential data DT_SQ.

As described above, the size of one sequential read data may be determined depending on information about the sequential data size SDS included in the sequential read information SQRI. The above-described information about the size of sequential data is an example, and the inventive concept is not limited thereto.

Figure 9A:
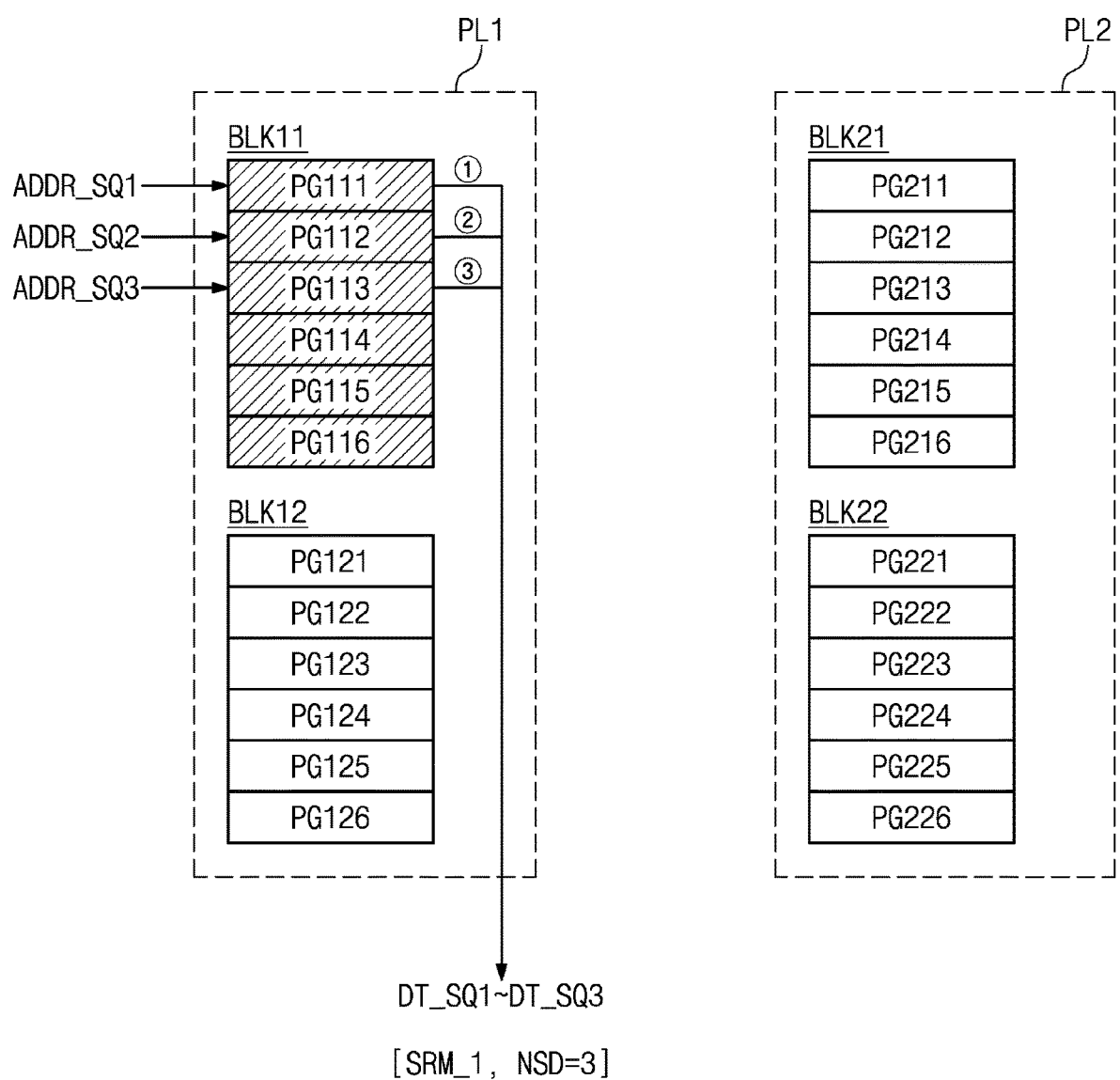
FIGS. 9A and 9B are diagrams for describing information about the number of sequential data illustrated in FIG. 6 according to example embodiments.
Figure 9B:
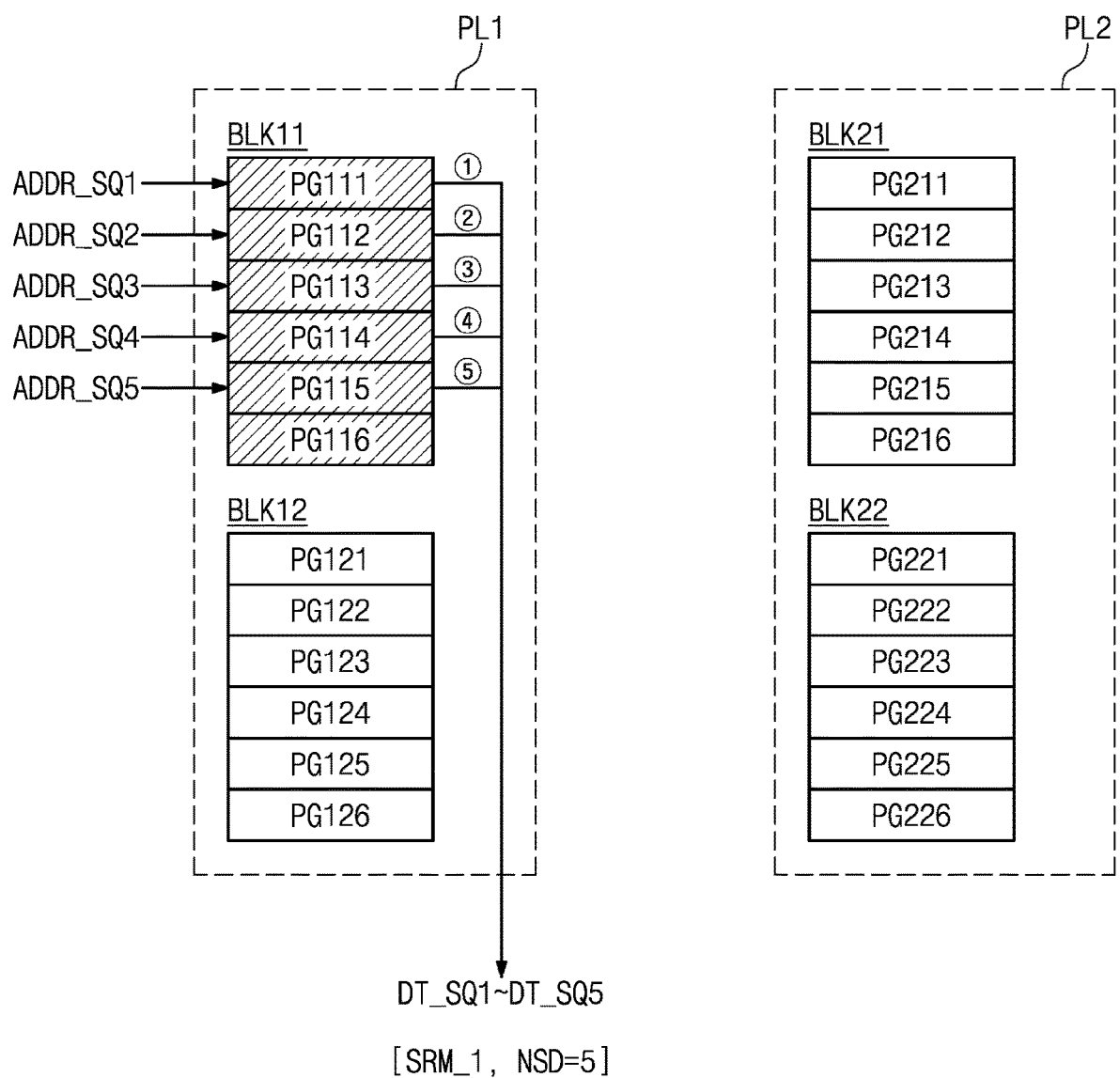

FIGS. 9A and 9B are diagrams for describing information about the number of sequential data NSD illustrated in FIG. 6 according to example embodiments. Referring to FIGS. 1, 6, 9A, and 9B, information about the number of sequential data NSD included in the sequential read information SQRI received from the memory controller 110 may indicate information about the number of unit sequential data to be output from the nonvolatile memory device 120.

For example, as illustrated in FIG. 9A, in the case where the information about the sequential read mode SRM included in the sequential read information SQRI indicates the first sequential read mode SRM_1 and the information about the number of sequential data NSD is "3", the sequential address generator 121 may generate addresses for three pages PG111, PG112, and PG113 as first to third sequential addresses ADDR_SQ1 to ADDR_SQ3. First to third sequential data DT_SQ1 to DT_SQ3 may be continuously output based on the first to third sequential addresses ADDR_SQ1 to ADDR_SQ3 thus generated.

In example embodiments, referring to FIGS. 8 and 9A, when the sequential data size information SDS is "1" and the number of sequential data NSD is "3", the nonvolatile memory device 120 may continuously output first to third sequential data DT_SQ1 to DT_SQ3. In this case, each of first to third sequential data DT_SQ1 to DT_SQ3 may include 4B data.

For another example, as illustrated in FIG. 9B, in the case where the information about the sequential read mode SRM included in the sequential read information SQRI indicates the first sequential read mode SRM_1 and the information about the number of sequential data NSD indicates "5", the sequential address generator 121 may generate addresses for five pages PG111, PG112, PG113, PG114, and PG115 as first to fifth addresses ADDR_SQ1 to ADDR_SQ5. First to fifth sequential data DT_SQ1 to DT_SQ5 may be continuously output based on the first to fifth sequential ADDR_SQ1 to ADDR_SQ5 thus generated.

In example embodiments, referring to FIGS. 8 and 9B, when the sequential data size information SDS is "2" and the number of sequential data NSD is "5", the nonvolatile memory device 120 may continuously output first to fifth sequential data DT_SQ1 to DT_SQ5. In this case, each of first to fifth sequential data DT_SQ1 to DT_SQ5 may include 4 KB data.

As described above, the nonvolatile memory device 120 according to the inventive concept may determine the number of sequential data to be transmitted to the memory controller 110, based on information about the number of sequential data NSD included in the sequential read information SQRI.

According to the above embodiments, the nonvolatile memory device 120 may generate a plurality of addresses ADDR_SQ (i.e., a plurality of sequential addresses ADDR_SQ or a plurality of random addresses ADDR_SQ) based on the sequential read information SQRI and may continuously transmit a plurality of sequential data DT_SQs corresponding to the plurality of addresses ADDR_SQ to the memory controller 110. In this case, the plurality of addresses ADDR_SQ may be generated in various manners based on the information about the sequential read mode SRM, the information about the sequential data size SDS, or the information about the number of sequential data NSD included in the sequential read information SQRI. Also, since a separate page-based command or address is not required while transmitting a plurality of sequential data DT_SQ, a speed at which the nonvolatile memory device 120 transmits a large amount of data is improved.

Figure 10:
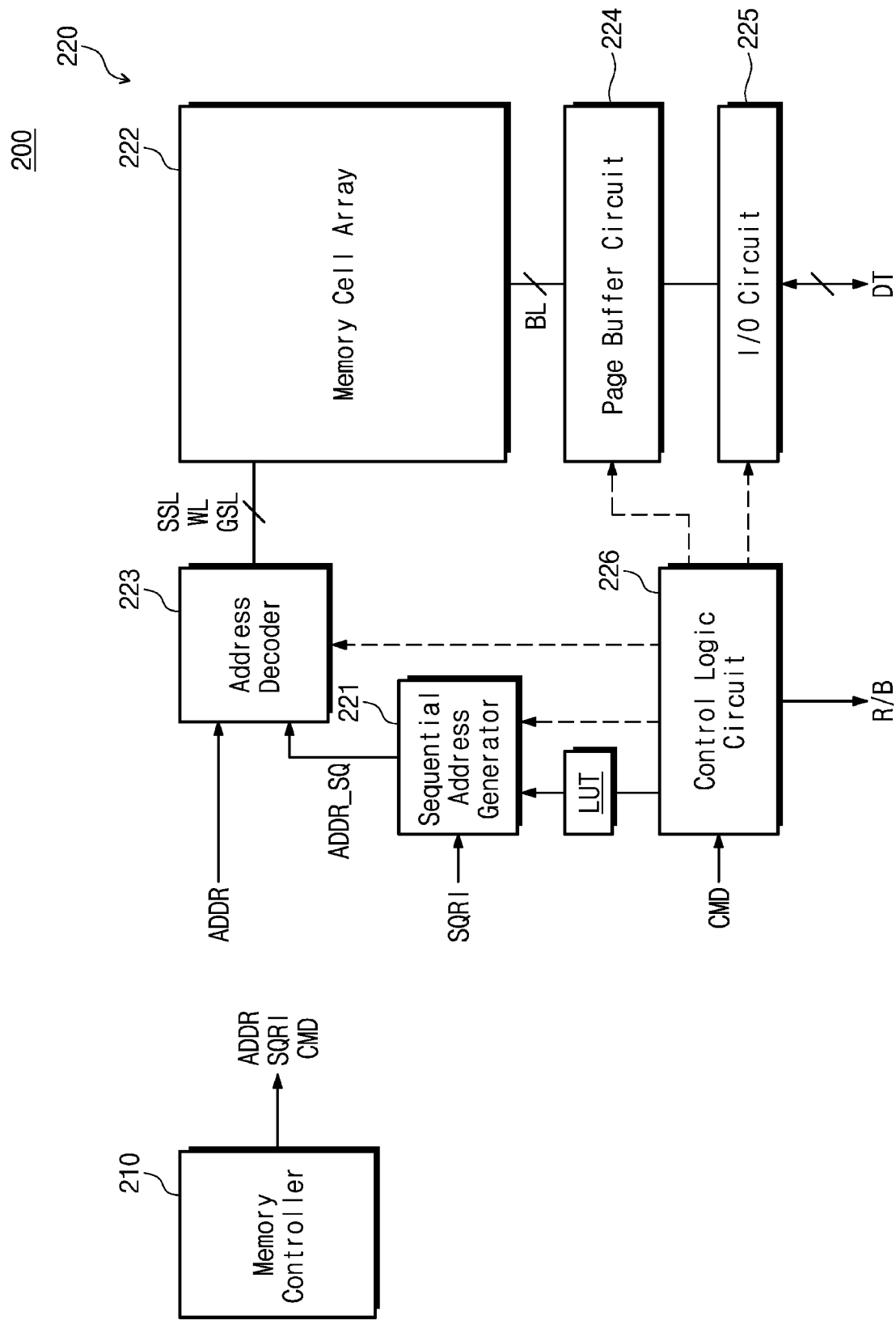
FIG. 10 is a block diagram illustrating a nonvolatile memory device according to an embodiment of the inventive concept.

FIG. 10 is a block diagram illustrating a nonvolatile memory device according to an embodiment of the inventive concept. FIG. 11 is a diagram illustrating a look-up table of FIG. 10 according to example embodiments. Referring to FIGS. 10 and 11, a memory system 200 may include a memory controller 210 and a nonvolatile memory device 220. The nonvolatile memory device 220 may include a sequential address generator 221, a memory cell array 222, an address decoder 223, a page buffer circuit 224, an input/output circuit 225, a control logic circuit 226, and a look-up table LUT. The memory cell array 222, the address decoder 223, the page buffer circuit 224, the input/output circuit 225, and the control logic circuit 226 are described with reference to 3, and thus, additional description will be omitted to avoid redundancy.

The look-up table LUT may include various information necessary to generate the address ADDR_SQ. For example, the sequential address generator 221 may generate the address ADDR_SQ based on the sequential read information SQRI. In this case, as described above, the sequential read information SQRI may include information about a sequential read mode SRM, information about the size of sequential data SDS, and information about the number of sequential data NSD. The look-up table LUT may include information associated with an address generation policy corresponding to information included in the sequential read information SQRI, the size of sequential read corresponding thereto, and various variables.

In detail, as illustrated in FIG. 11, the look-up table LUT may include information about an address generation policy corresponding to each of a plurality of sequential read modes SRM_1 to SRM_n. Based on the look-up table LUT, the sequential address generator 221 may select a policy corresponding to a sequential read mode SRM of the sequential read information SQRI received from the memory controller 110 and may generate a plurality of sequential addresses ADDR_SQ or a plurality of random addresses ADDR_SQ based on the selected policy.

In detail, the first sequential read mode SRM_1 may refer to an operation mode in which data of first to last pages of an i-th block are output, the second sequential read mode SRM_2 may refer to an operation mode in which data of a-th to b-th pages of the i-th block are output, the third sequential read mode SRM_3 may refer to an operation mode in which data of a c-th page of each block are output. In an exemplary embodiment, an n-th sequential read mode SRM_n may refer to an operation mode in which data of pages according to a policy customized by the memory controller 110 or the user are output. The sequential address generator 221 may generate the plurality of sequential addresses ADDR_SQ or a plurality of random addresses ADDR_SQ, based on a policy corresponding to each of the above-described sequential read modes.

In an exemplary embodiment, the above-described variables (e.g., "i", "a", and "b") indicating particular memory blocks or particular pages may be stored in the look-up table LUT, and may be changed under control of a memory controller 210. For example, the sequential address generator 221 may generate the plurality of addresses ADDR_SQ, based on various variables stored in the look-up table LUT and a selected policy.

FIG. 12A is a flowchart illustrating an operation of a nonvolatile memory device of FIG. 10 according to example embodiments. Referring to FIGS. 10 and 12A, in operation S201, the nonvolatile memory device 220 may set the look-up table LUT through a set feature command or an initialization operation. For example, when the memory system 200 is booted up, the nonvolatile memory device 220 may be initialized under control of the memory controller 210. In this case, the memory controller 210 may set various information necessary for the sequential read operation to the look-up table LUT.

Alternatively, while the memory system 200 is driven, the memory controller 210 may change various information stored in the look-up table LUT through the set feature command.

Afterwards, the nonvolatile memory device 220 may perform operation S210 to operation S230. Operation S210 to operation S230 may be similar to operation S110 to operation S130 of FIGS. 5A and 5B, and thus, a detailed description thereof will not be repeated here.

In operation S240, the nonvolatile memory device 220 may generate the address ADDR_SQ based on the sequential read information SQRI and the look-up table LUT. For example, based on the look-up table LUT, the sequential address generator 221 may select a policy corresponding to the sequential read mode SRM included in the sequential read information SQRI and may generate a plurality of addresses ADDR_SQ based on the selected policy. In an exemplary embodiment, the sequential address generator 221 may determine a start point or an offset of the plurality of addresses ADDR_SQ based on information about various variables included in the look-up table LUT.

Afterwards, the nonvolatile memory device 220 may perform operation S250 and operation S260. Operation S250 and operation S260 may be similar to operation S150 and operation S160 of FIG. 5A, and thus, a detailed description thereof will not be repeated here.

Figure 12B:
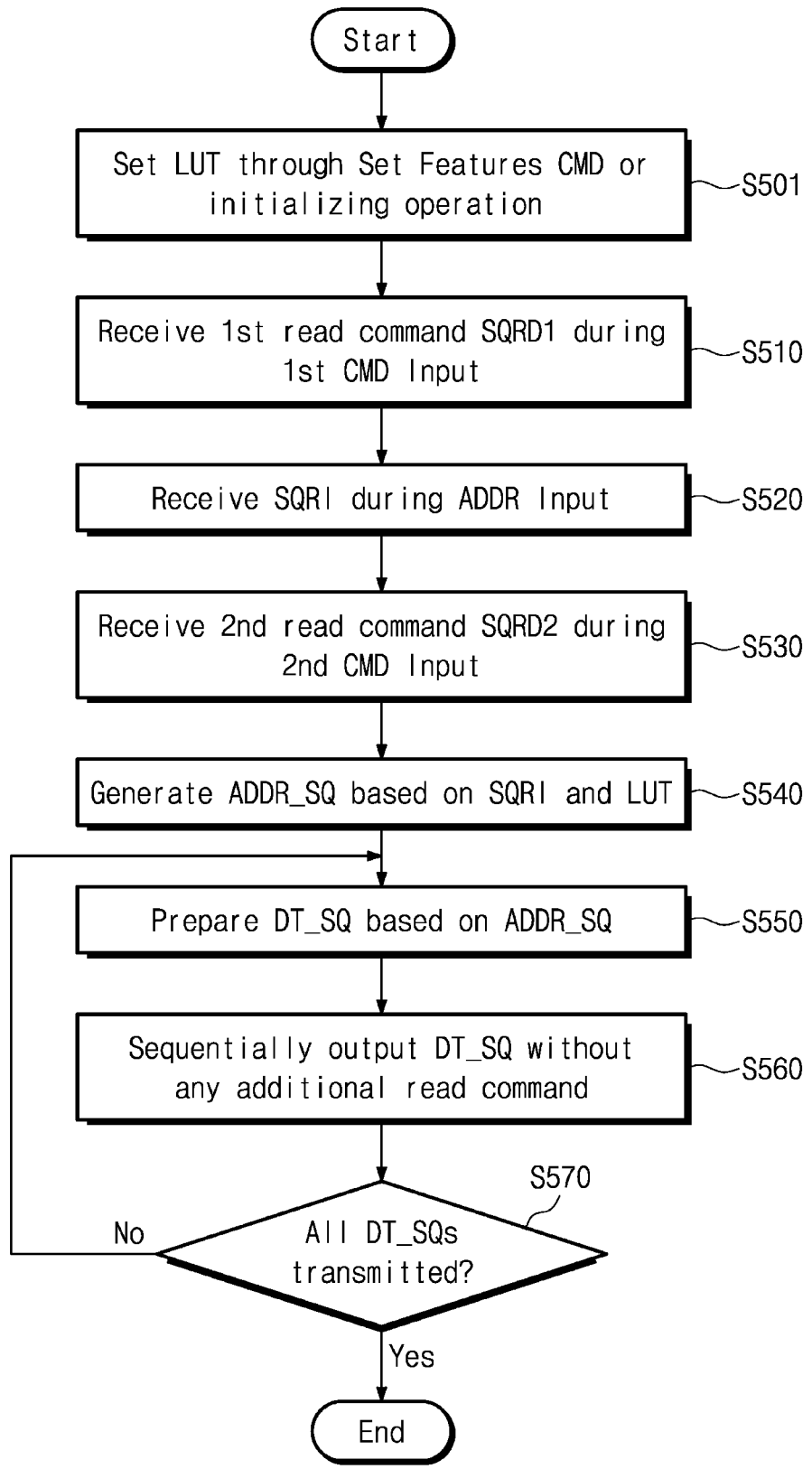
FIG. 12B is a flowchart illustrating an operation of a nonvolatile memory device of FIG. 10 according to example embodiments.

FIG. 12B is a flowchart illustrating a sequential read operation of a nonvolatile memory device of FIG. 10 according to example embodiments. Referring to FIGS. 10 and 12B, the nonvolatile memory device 220 may perform operation S501 to operation S570. Operation S501 to operation S540 are similar to operation S201 to operation S240 of FIG. 12A, and thus, a detailed description thereof will not be repeated here.

In operation S550, the nonvolatile memory device 220 may prepare a first sequential data DT_SQ based on a first address ADDR_SQ. For example, the first sequential data DT_SQ may be prepared in the page buffer circuit 224 or in the input/output circuit 225. In operation S560, the nonvolatile memory device 220 may sequentially output the first sequential data DT_SQ without any additional read command.

In operation S570, the nonvolatile memory device 220 may determine whether all sequential data DT_SQs based on the sequential read information SQRI and the look-up table LUT are transmitted.

In the case where all the sequential data DT_SQs are not yet transmitted to the memory controller 210 (i.e., in the case where sequential data DT_SQ not transmitted to the memory controller 210 exist), the nonvolatile memory device 220 may repeatedly perform operations S550 and S560. For example, in operation S550, the nonvolatile memory device 220 may prepare second sequential data DT_SQ based on a second address ADDR_SQ. For example, the second sequential data DT_SQ may be prepared in the page buffer circuit 224 or in the input/output circuit 225. In operation S560, the nonvolatile memory device 220 may sequentially output the second sequential data DT_SQ after outputting the first sequential data DT_SQ without any additional read command.

Figure 13:
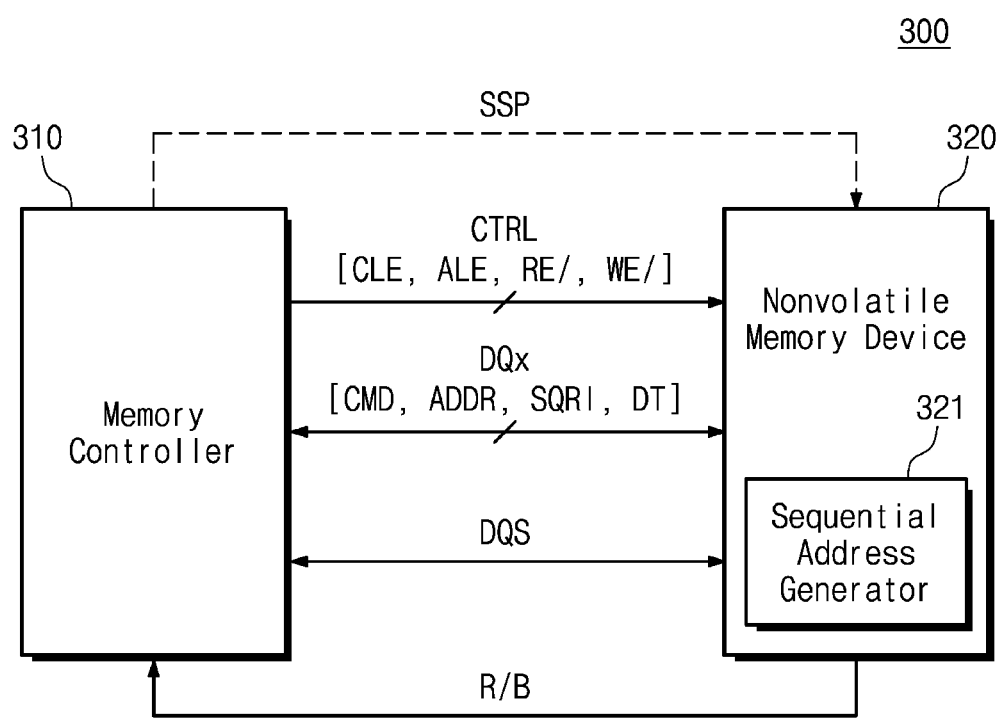
FIG. 13 is a block diagram illustrating a memory system according to an embodiment of the inventive concept.

FIG. 13 is a block diagram illustrating a memory system according to an embodiment of the inventive concept. Referring to FIG. 13, a memory system 300 may include a memory controller 310 and a nonvolatile memory device 320. The nonvolatile memory device 320 may include a sequential address generator 321. The memory controller 310, the nonvolatile memory device 320, and the sequential address generator 321 are described above, and thus, a detailed description thereof will not be repeated here.

The memory controller 310 of FIG. 13 may provide a suspend signal SSP to the nonvolatile memory device 320. The suspend signal SSP may be a signal for suspending the output of a plurality of sequential data DT_SQs from the nonvolatile memory device 320. For example, in the case where the nonvolatile memory device 320 performs the sequential read operation, a plurality of sequential data DT_SQs may be continuously output through the data lines DQx. The memory controller 310 may provide the suspend signal SSP to the nonvolatile memory device 320 for the purpose of allowing the nonvolatile memory device 320 to suspend the output of the plurality of sequential data DT_SQs. The nonvolatile memory device 320 may suspend the sequential read operation (i.e., an operation of outputting sequential data) in response to the received suspend signal SSP.

In an exemplary embodiment, the suspend signal SSP may be provided to the nonvolatile memory device 320 through a separate signal line. Alternatively, the suspend signal SSP may be provided through a data line DQx or may be provided as a combination of signals provided through the control signal lines CTRL.

Figure 14:
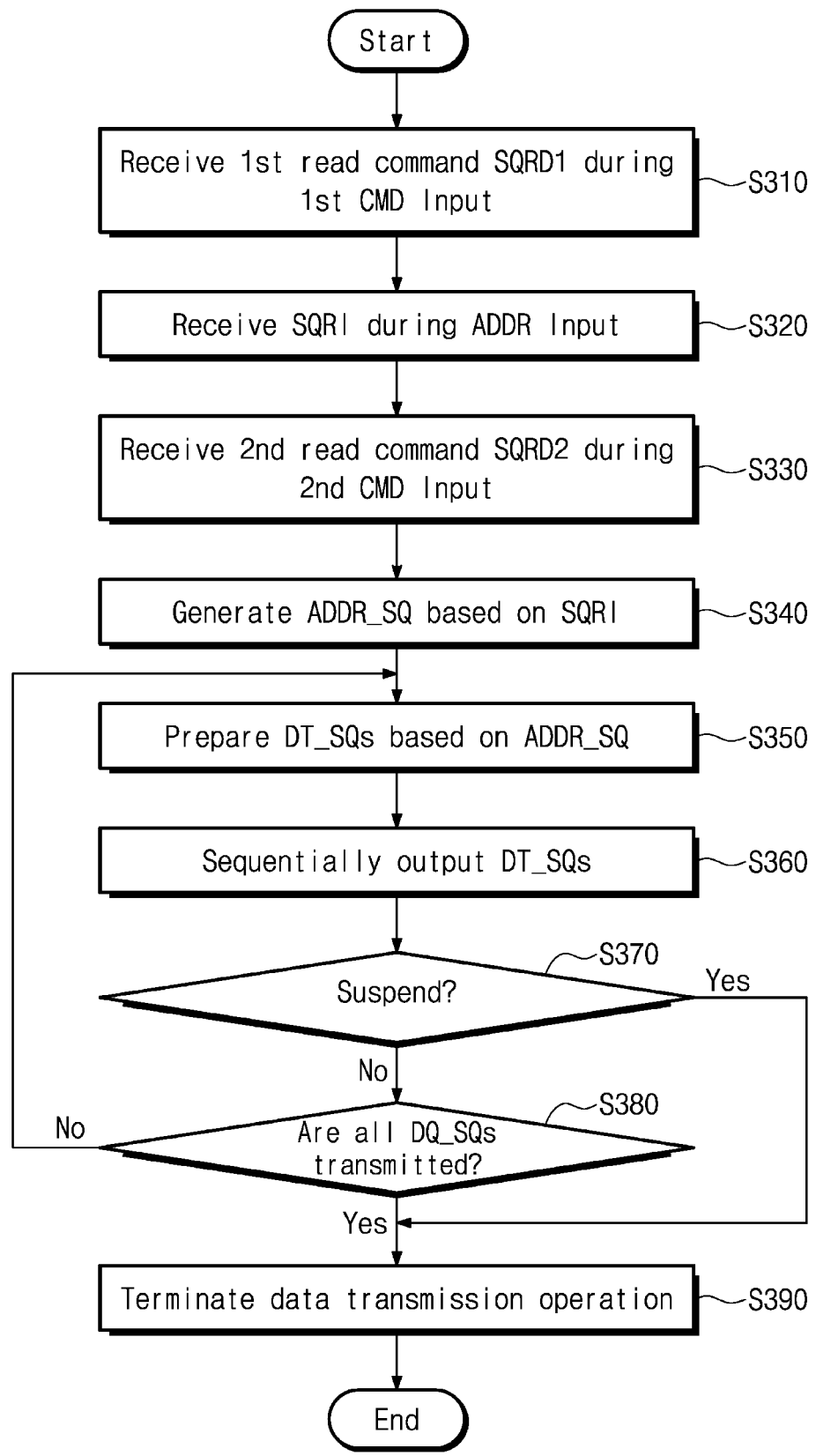
FIG. 14 is a flowchart illustrating an operation of a nonvolatile memory device of FIG. 13 according to example embodiments.

FIG. 14 is a flowchart illustrating an operation of a nonvolatile memory device of FIG. 13 according to example embodiments. Referring to FIGS. 13 and 14, the nonvolatile memory device 320 may perform operation S310 to operation S360. Operation S310 to operation S360 are similar to operation S110 to operation S160 of FIG. 5A or operation S210 to operation S260 of FIG. 12A, and thus, a detailed description thereof will not be repeated here.

In operation S370, the nonvolatile memory device 320 may determine whether a suspend operation is requested from the memory controller 310. For example, the nonvolatile memory device 320 may receive the suspend signal SSP from the memory controller 310 while outputting a plurality of sequential data DT_SQs. In this case, in response to the suspend signal SSP, the nonvolatile memory device 320 may determine that the suspend operation is requested from the memory controller 310.

In the case where the suspend operation is not requested (i.e., in the case where the suspend signal SSP is not received from the memory controller 310), in operation S380, the nonvolatile memory device 320 may determine whether all sequential data DT_SQs are transmitted. The all sequential data DT_SQs may be data outputting based on the sequential read information. As an example, all the sequential data DT_SQs may be the first to third sequential data DT_SQ1 to DT_SQ3 in FIG. 9A or the first to fifth sequential data DT_SQ1 to DT_SQ5 in FIG. 9B. In the case where all the sequential data DT_SQs are transmitted to the memory controller 310, in operation S390, the nonvolatile memory device 320 may terminate the data transmission operation.

In the case where all the sequential data DT_SQs are not yet transmitted to the memory controller 310 (i.e., in the case where sequential data DT_SQ not transmitted to the memory controller 310 exist), the nonvolatile memory device 320 performs operations S350 and S360.

In the case where a determination result of operation S370 indicates that the suspend operation is requested from the memory controller 310, the nonvolatile memory device 320 performs operation S390. For example, in the case where the suspend signal SSP is received from the memory controller 310 while the plurality of sequential data DT_SQ are transmitted, the nonvolatile memory device 320 may suspend an operation of transmitting the sequential data DT_SQ.

In an exemplary embodiment, the nonvolatile memory device 320 may suspend the sequential data transmission operation as soon as the suspend signal SSP is received from the memory controller 310. Alternatively, after unit sequential data (i.e., sequential data corresponding to one address) being transmitted at a time point when the suspend signal SSP is received from the memory controller 310 are completely transmitted, the nonvolatile memory device 320 may suspend the transmission operation associated with the remaining sequential data.

As described above, the nonvolatile memory device 320 according to an embodiment of the inventive concept may continuously output a plurality of sequential data without an invoke or issue of a separate command or address from the memory controller 310. In this case, the nonvolatile memory device 320 may suspend the sequential data transmission operation in response to the suspend signal SSP received from the memory controller 310.

Figure 15A:
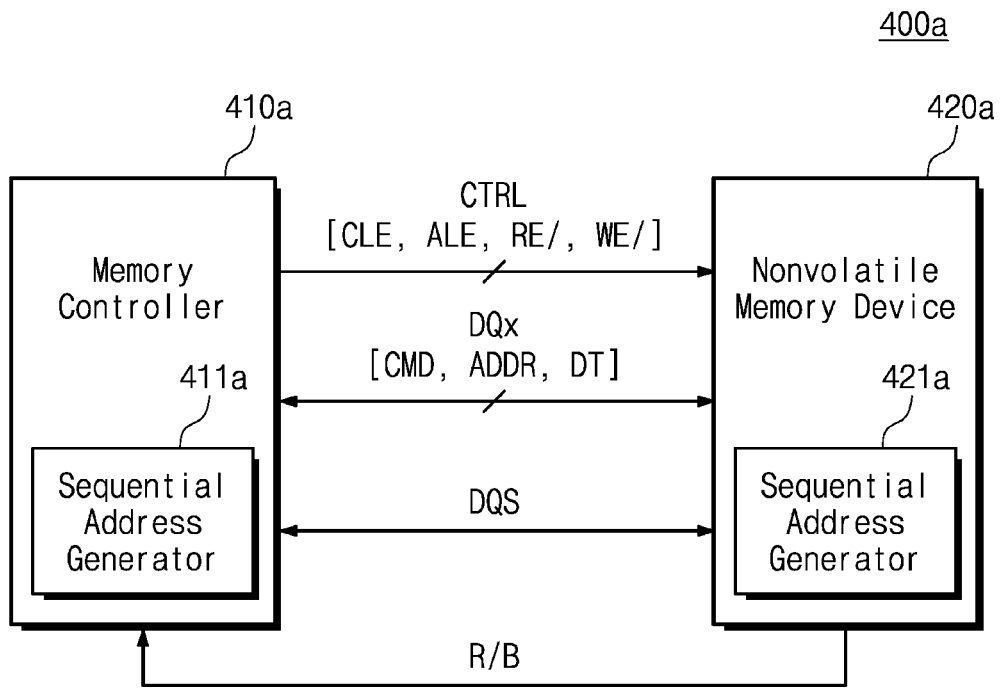
FIGS. 15A and 15B are block diagrams illustrating memory systems according to an embodiment of the inventive concept.
Figure 15B:
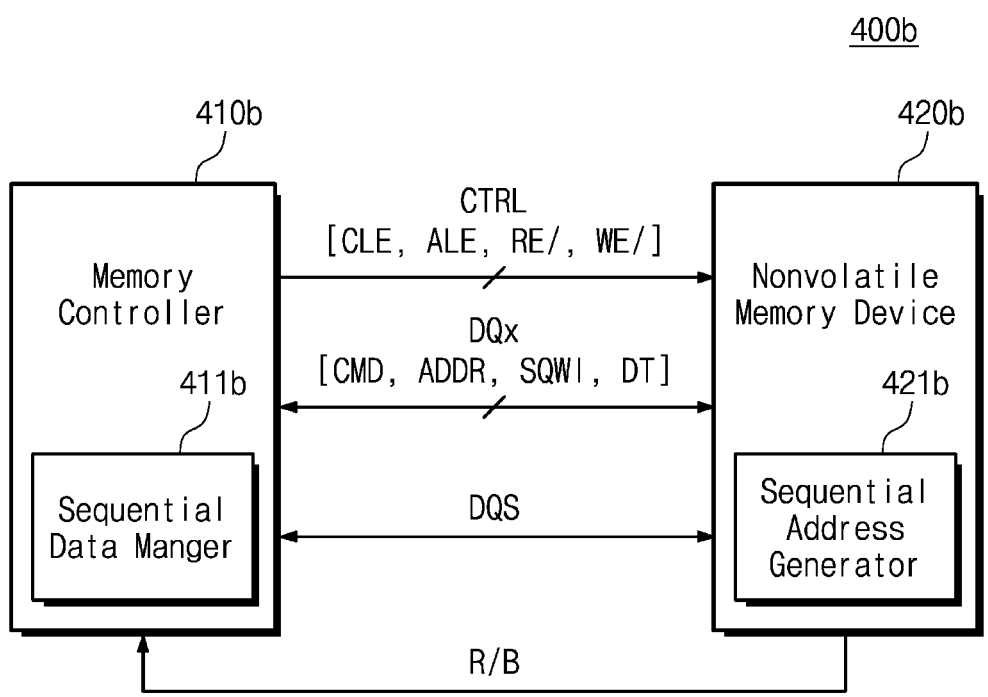

FIGS. 15A and 15B are block diagrams illustrating memory systems according to an embodiment of the inventive concept. FIG. 16A is a diagram illustrating information managed by a sequential address generator 411a included in a memory controller 410a of FIG. 15A according to example embodiments, and FIG. 16B is a diagram illustrating information managed by a sequential data manager 411b included in a memory controller 410b of FIG. 15B according to example embodiments.

Referring to FIGS. 15A and 16A, a memory system 400a includes a memory controller 410a and a nonvolatile memory device 420a. The memory controller 410a may include the sequential address generator 411a, and the nonvolatile memory device 420a may include a sequential address generator 421a. The nonvolatile memory device 420a and the sequential address generator 421a are the same as described above, and thus, a detailed description thereof will not be repeated here.

An operation of the sequential address generator 411a included in the memory controller 410a may be identical to an operation of the sequential address generator 421a of the nonvolatile memory device 420a. For example, the sequential address generator 411a of the memory controller 410a may generate a plurality of sequential addresses ADDR_SQ or a plurality of random addresses ADDR_SQ based on particular information.

The addresses ADDR_SQ generated from the sequential address generator 411a of the memory controller 410a may be used to manage data programmed to the nonvolatile memory device 420a. For example, as illustrated in FIG. 16A, the memory controller 410a may include address information about a plurality of sets of data DT_1 to DT_m. In this case, each of the plurality of sets of data DT_1 to DT_m may be data of a large amount, which have different attributes or different kinds from each other.

For example, the sequential address generator 411a of the memory controller 410a may generate a plurality of addresses ADDR_SQ11 to ADDR_SQ1i (i.e., sequential addresses ADDR_SQ11 to ADDR_SQ1i or a plurality of random addresses ADDR_SQ11 to ADDR_SQ1i) corresponding to a region where the first set of data DT_1 are to be stored. The memory controller 410a may control the nonvolatile memory device 420a such that the first set of data DT_1 are stored to the region corresponding to the plurality of addresses ADDR_SQ11 to ADDR_SQ1i thus generated. For example, the memory controller 410a may provide the first set of data DT_1 and the plurality of addresses ADDR_SQ11 to ADDR_SQ1i to the nonvolatile memory device 420a. The nonvolatile memory device 420a may store the first set of data DT_1 to the region (or a page) corresponding to the plurality of addresses ADDR_SQ11 to ADDR_SQ1i.

Likewise, with regard to the second to m-th sets of data DT_2 to DT_m, the memory controller 410a may generate a plurality of addresses "ADDR_SQ21 to ADDR_SQ2k" to "ADDR_SQm1 to ADDR_SQmj", and may control the nonvolatile memory device 420a such that the second to m-th data DT_2 to DT_m are respectively stored to regions corresponding to the plurality of addresses "ADDR_SQ21 to ADDR_SQ2k" to "ADDR_SQm1 to ADDR_SQmj" thus generated.

In an exemplary embodiment, the nonvolatile memory device 420a may respectively output the first to m-th data DT_1 to DT_m through the sequential read operation described with reference to FIGS. 1 to 3, 5A, 5B, 6, 7A to 7D, 8, 9A, 9B, 10, 11, 12A, 12B, 13, 14. In an embodiment, the information illustrated in FIG. 16A may be managed in the flash translation layer FTL described with reference to FIG. 2.

Referring to FIGS. 15B and 16B, a memory system 400b includes the memory controller 410b and a nonvolatile memory device 420b. The memory controller 410b may include the sequential data manager 411b, and the nonvolatile memory device 420b may include a sequential address generator 421b. The nonvolatile memory device 420b and the sequential address generator 421b are the same as described above, and thus, a detailed description thereof will not be repeated here.

The sequential data manager 411b of the memory controller 410b may be configured to manage sequential read information about a large amount of data to be stored to the nonvolatile memory device 420b. For example, as illustrated in FIG. 16B, the sequential data manager 411b may manage information about a sequential read mode SRM, information about the size of sequential data SDS, information about the number of sequential data NSD, and information about variables with regard to each of the plurality of sets of data DT_1 to DT_m.

The memory controller 410b may store the plurality of sets of data DT_1 to DT_m to the nonvolatile memory device 420b, based on the information managed by the sequential data manager 411b. For example, to store the first set of data DT_1 to the nonvolatile memory device 420b, the memory controller 410b may provide, as sequential write information SQWI, information (e.g., SRM_1, SDS_1, NSD_1, and V_1) corresponding to the first set of data DT_I1 to the nonvolatile memory device 420b. The sequential address generator 421b of the nonvolatile memory device 420b may generate a plurality of addresses ADDR_SQ based on the sequential write information SQWI. An operation of the sequential address generator 421b is similar to the above disclosed operation, and thus, additional description will be omitted to avoid redundancy. The nonvolatile memory device 420b may store the first set of data DT_1 to a region (or a page) corresponding to one of the plurality of addresses ADDR_SQ.

As described above, in the case where the memory controller 410a or 410b stores a large amount of data to the nonvolatile memory device 420a or 420b, the memory controller 410a or 410b may store a large amount of data to the nonvolatile memory device 420a or 420b by directly generating and managing a plurality of addresses for a sequential read operation or by directly managing overall information (e.g., the sequential read mode SRM, the size of sequential data SDS, the number of sequential data NSD, or a variable) for generating a plurality of addresses. In the case where a sequential read operation for a large amount of stored data is performed, the large amount of data may be normally output from the nonvolatile memory device 420a or 420b.

Figure 17:
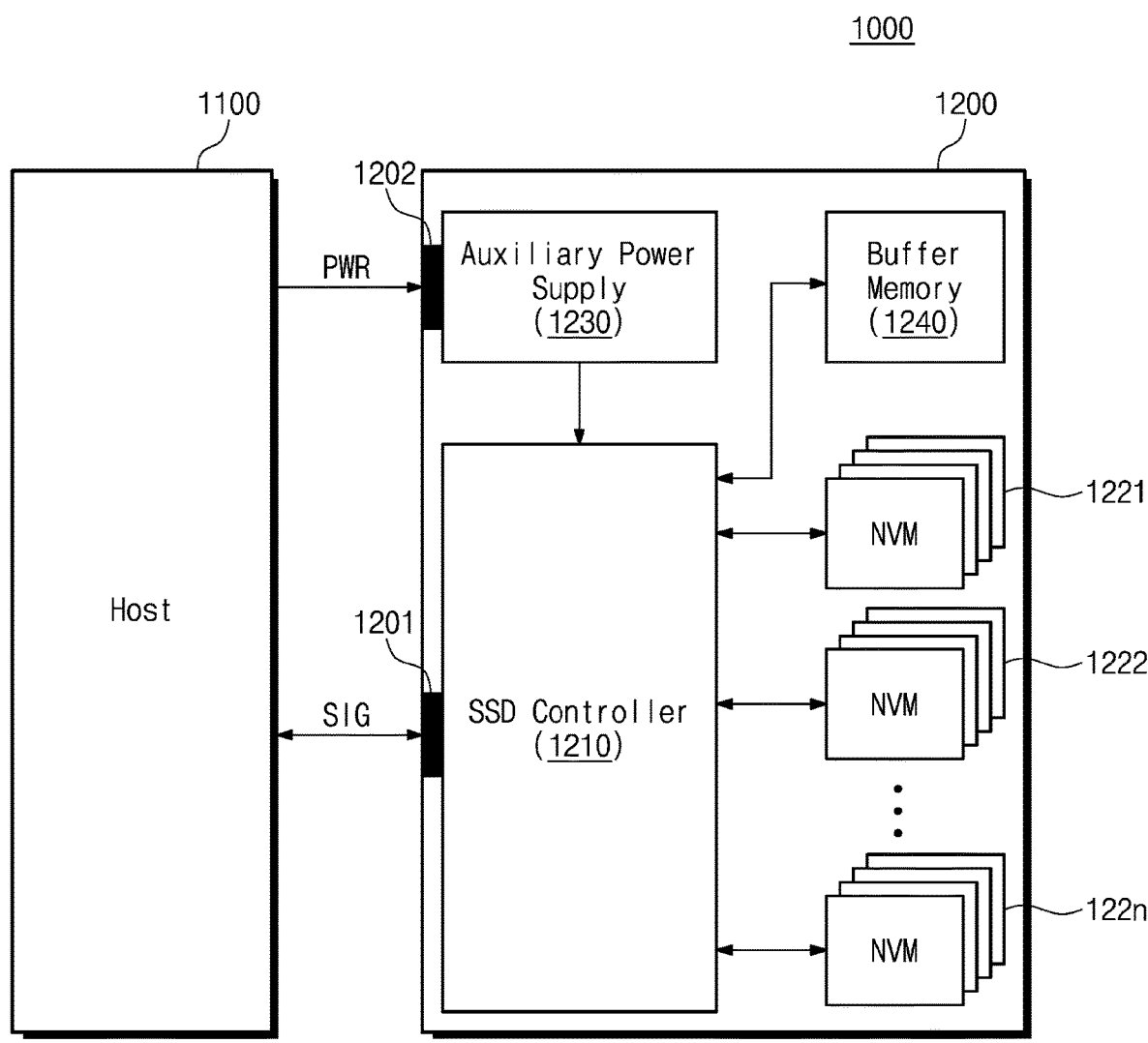
FIG. 17 is a block diagram illustrating a solid state drive system to which a nonvolatile memory device according to the inventive concept is applied.

FIG. 17 is a block diagram illustrating a solid state drive (SSD) system 1000 to which a nonvolatile memory device according to the inventive concept is applied. Referring to FIG. 17, the SSD system 1000 may include a host 1100 and an SSD 1200.

The SSD 1200 transmits and receives a signal SIG to and from the host 1100 through a signal connector 1201 and is supplied with a power PWR through a power connector 1202. The SSD 1200 includes an SSD controller 1210, a plurality of flash memories 1221 to 122n, an auxiliary power supply 1230, and a buffer memory 1240. In an exemplary embodiment, each of the plurality of flash memories 1221 to 122n may be configured to perform the sequential read operation described with reference to FIGS. 1 to 3, 5A, 5B, 6, 7A to 7D, 8, 9A, 9B, 10, 11, 12A, 12B, 13, 14, 15A, 15B, 16A and 16B.

The SSD controller 1210 may control the plurality of flash memories 1221 to 122n in response to the signal SIG received from the host 1100. The plurality of flash memories 1221 to 122n may operate under control of the SSD controller 1210. The auxiliary power supply 1230 is connected to the host 1100 via the power connector 1202. The auxiliary power supply 1230 may be charged by the power PWR from the host 1100. In the case where the power PWR is not smoothly supplied from the host 1100, the auxiliary power supply 1230 may provide the power of the SSD 1200.

According to the inventive concept, a page-based/page-unit command or address is not required while a nonvolatile memory device outputs a plurality of sequential data. As such, since an overhead due to an issue of a command or an address upon reading a large amount of data decreases, the nonvolatile memory device with improved performance, an operation method of the nonvolatile memory device, and an operation method of a memory controller controlling the nonvolatile memory device are provided.

While the inventive concept has been described with reference to exemplary embodiments thereof, it will be apparent to those of ordinary skill in the art that various changes and modifications may be made thereto without departing from the spirit and scope of the inventive concept as set forth in the following claims.

What is claimed is:

1. A nonvolatile memory device comprising:
   a memory cell array including a plurality of memory cells connected to a plurality of word lines;
   a control logic circuit configured to receive a first sequential read command and a second sequential read command following the first sequential read command from outside the nonvolatile memory device;
   a sequential address generator configured to generate a plurality of sequential addresses based on sequential read information received from the outside of the nonvolatile memory device, under control of the control logic circuit receiving the first and second sequential read commands;
   an address decoder connected to the memory cell array through the plurality of word lines, and configured to sequentially select a plurality of pages in at least one word line, which correspond to the plurality of sequential addresses, from among the plurality of word lines, under control of the control logic circuit receiving the first and second sequential read commands;
   a page buffer circuit connected to the memory cell array through a plurality of bit lines, and configured to prepare a plurality of sequential data from memory cells connected to the selected pages by the address decoder, under control of the control logic circuit receiving the sequential first and second read commands; and
   an input/output circuit configured to continuously output the plurality of sequential data from the page buffer circuit to the outside of the nonvolatile memory device through data lines, under control of the control logic circuit,
   wherein the control logic circuit is configured to receive the first sequential read command during a first command input interval, and to receive the second sequential read command during a second command input interval following the first command input interval,
   wherein the sequential address generator is configured to receive the sequential read information during an address input interval between the first command input interval and the second command input interval, and
   wherein after the second command input interval, the input/output circuit continuously outputs the plurality of sequential data from the selected pages based on the sequential read information.

2. The nonvolatile memory device of claim 1, wherein the input/output circuit is configured to continuously output the plurality of sequential data without receiving an additional command or an address from the outside of the nonvolatile memory device at the control logic circuit.

3. The nonvolatile memory device of claim 1, wherein the sequential address generator is configured to receive the sequential read information through the data lines in synchronization with a rising edge of a write enable signal received from the outside of the nonvolatile memory device, during the address input interval, where a command latch enable signal from the outside of the nonvolatile memory device is logical low and an address latch enable signal from the outside of the nonvolatile memory device is logical high.

4. The nonvolatile memory device of claim 3, wherein the control logic circuit is configured to receive the sequential read information within 5 periods of the write enable signal.

5. The nonvolatile memory device of claim 1, wherein the plurality of sequential data are continuously output in synchronization with a rising edge and a falling edge of a data strobe signal based on a read enable signal received from the outside of the nonvolatile memory device.

6. The nonvolatile memory device of claim 1, wherein the sequential read information includes information about a sequential read mode, information about a size of each of the plurality of sequential data, and information about the number of the plurality of sequential data.

7. The nonvolatile memory device of claim 6, further comprising:
   a storage circuit configured to store a look-up table including correspondence information of the sequential read mode of the sequential read information and a sequential address generation policy.

8. The nonvolatile memory device of claim 7, wherein the sequential address generator is configured to generate the plurality of sequential addresses based on the sequential address generation policy corresponding to the sequential read mode received from the outside of the nonvolatile memory device.

9. The nonvolatile memory device of claim 7, wherein the look-up table is configured to be updated in response to a set feature command received from the outside of the nonvolatile memory device.

10. The nonvolatile memory device of claim 1, wherein the control logic circuit is further configured to receive a suspend signal received from the outside of the nonvolatile memory device while the plurality of sequential data are continuously output, and to suspend an output operation associated with the plurality of sequential data in response to the received suspend signal.

11. An operation method of a nonvolatile memory device, the method comprising:
receiving a first sequential read command from outside the nonvolatile memory device through data lines during a first command input interval;
receiving sequential read information from the outside of the nonvolatile memory device through the data lines during an address input interval following the first command input interval;
receiving a second sequential read command from the outside of the nonvolatile memory device through the data lines during a second command input interval following the address input interval; and
continuously outputting a plurality of sequential data based on the sequential read information after the second command input interval,
wherein the plurality of sequential data correspond to a plurality of physical pages, respectively.

12. The method of claim 11, further comprising:
during the address input interval, receiving a command latch enable signal of logical low received from the outside of the nonvolatile memory device, and an address latch enable signal of logical high received from the outside of the nonvolatile memory device,
wherein the sequential read information is received in synchronization with a rising edge of a write enable signal received from the outside of the nonvolatile memory device.

13. The method of claim 11, further comprising:
during the first command input interval and the second command input interval, receiving a command latch enable signal of logical high received from the outside of the nonvolatile memory device, and an address latch enable signal of logical low received from the outside of the nonvolatile memory device,
wherein the first sequential read command and the second sequential read command are received in synchronization with a rising edge of a write enable signal received from the outside of the nonvolatile memory device.

14. The method of claim 11, wherein the plurality of sequential data are continuously output to the outside of the nonvolatile memory device in synchronization with a data strobe signal toggling based on a read enable signal received from the outside of the nonvolatile memory device.

15. The method of claim 11, wherein, until the plurality of sequential data are completely output, an additional command or an address is not received by the nonvolatile memory device from the outside of the nonvolatile memory device.

16. An operation method of a memory controller which controls a nonvolatile memory device including a plurality of pages, the method comprising:
transmitting a first sequential read command to the nonvolatile memory device through data lines during a first command input interval;
transmitting sequential read information to the nonvolatile memory device through the data lines during an address input interval following the first command input interval;
transmitting a second sequential read command to the nonvolatile memory device through the data lines during a second command input interval following the address input interval; and
after the second command input interval, providing a read enable signal to the nonvolatile memory device to continuously receive a plurality of sequential data from selected pages from among the plurality of pages of the nonvolatile memory device.

17. The method of claim 16, further comprising:
during the first and second command input intervals, transmitting a command latch enable signal of logical high to the nonvolatile memory device, and an address latch enable signal of logical low to the nonvolatile memory device,
wherein the read enable signal is logical high, and each of the first and second sequential read commands is transmitted to the nonvolatile memory device in synchronization with a rising edge of a write enable signal.

18. The method of claim 16, further comprising:
during the address input interval, transmitting a command latch enable signal of logical low to the nonvolatile memory device, and an address latch enable signal of logical high to the nonvolatile memory device,
wherein the read enable signal is logical high, and the sequential read information is transmitted to the nonvolatile memory device in synchronization with a rising edge of a write enable signal.

19. The method of claim 16, wherein, after a ready/busy signal received from the nonvolatile memory device transitions to a ready state, the read enable signal is provided to the nonvolatile memory device.

20. The method of claim 16, wherein an additional command or an address is not transmitted to the nonvolatile memory device through the data lines until the plurality of sequential data are completely received from the nonvolatile memory device.

* * * * *